(12) United States Patent
Duncan et al.

(10) Patent No.: US 9,887,177 B2
(45) Date of Patent: *Feb. 6, 2018

(54) SYSTEMS, METHODS AND DEVICES FOR INTER-SUBSTRATE COUPLING

(71) Applicant: Elwha LLC, Bellevue, WA (US)

(72) Inventors: William David Duncan, Mill Creek, WA (US); Roderick A. Hyde, Redmond, WA (US); Jordin T. Kare, Seattle, WA (US); Thomas M. McWilliams, Oakland, CA (US); Thomas Allan Weaver, San Mateo, CA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/527,521

(22) Filed: Oct. 29, 2014

(65) Prior Publication Data

US 2016/0128192 A1 May 5, 2016

(51) Int. Cl.
*H01L 23/02* (2006.01)
*H01L 25/065* (2006.01)
*H01L 23/64* (2006.01)

(52) U.S. Cl.
CPC ........ *H01L 25/0657* (2013.01); *H01L 23/642* (2013.01); *H01L 2223/6627* (2013.01); *H01L 2223/6638* (2013.01); *H01L 2225/06513* (2013.01); *H01L 2225/06531* (2013.01); *H01L 2225/06541* (2013.01); *H01L 2924/1434* (2013.01); *H01L 2924/19041* (2013.01); *H01L 2924/19103* (2013.01); *H01L 2924/19104* (2013.01)

(58) Field of Classification Search
None
See application file for complete search history.

(56) References Cited

U.S. PATENT DOCUMENTS

| 5,629,838 | A | 5/1997 | Knight et al. |
| 6,049,974 | A | 4/2000 | Asanasavest |
| 6,728,113 | B1 | 4/2004 | Knight et al. |
| 6,916,719 | B1 * | 7/2005 | Knight ............... G01R 31/3025 257/664 |
| 6,967,347 | B2 | 11/2005 | Estes et al. |
| 7,148,074 | B1 | 12/2006 | Drost et al. |

(Continued)

OTHER PUBLICATIONS

Eberle, Hans et al., "Multiterabit Switch Fabrics Enabled by Proximity Communication", Symposium on High-Performance Ships (Hot Chips), Stanford University, Sun Microsystems Laboratories, Aug. 2007.

(Continued)

*Primary Examiner* — Jesse Y Miyoshi
*Assistant Examiner* — Tuan A Hoang

(57) ABSTRACT

Inter-substrate coupling and alignment using liquid droplets can include electrical and plasmon modalities. For example, a set of droplets can be placed on a bottom substrate. A top substrate can be placed upon the droplets, which uses the droplets to align the substrates. Using the droplets in a capacitive or plasmon coupling modality, information or power can be transferred between the substrates using the droplets.

38 Claims, 32 Drawing Sheets

(56) References Cited

U.S. PATENT DOCUMENTS

| | | | | |
|---|---|---|---|---|
| 7,211,754 | B2* | 5/2007 | Wang | H01H 29/28 |
| | | | | 200/182 |
| 7,488,908 | B2 | 2/2009 | Beerling | |
| 7,994,608 | B2 | 8/2011 | Tan et al. | |
| 8,697,543 | B2* | 4/2014 | Sui | H01L 24/95 |
| | | | | 257/774 |
| 8,830,016 | B2* | 9/2014 | Rofougaran | H01F 21/06 |
| | | | | 200/181 |
| 8,872,527 | B2* | 10/2014 | Sturmer | G01N 27/22 |
| | | | | 324/658 |
| 2006/0234405 | A1* | 10/2006 | Best | H01L 23/48 |
| | | | | 438/15 |
| 2006/0260919 | A1* | 11/2006 | Aimi | H01H 11/02 |
| | | | | 200/83 F |
| 2007/0084944 | A1* | 4/2007 | Hedler | H01L 24/26 |
| | | | | 239/11 |
| 2010/0129085 | A1* | 5/2010 | Smolyaninov | B82Y 20/00 |
| | | | | 398/141 |
| 2012/0261264 | A1 | 10/2012 | Srinivasan et al. | |
| 2013/0068622 | A1 | 3/2013 | Schertzer et al. | |
| 2013/0123139 | A1* | 5/2013 | Kim | B01L 3/5085 |
| | | | | 506/9 |
| 2016/0126217 | A1* | 5/2016 | Duncan | H01L 23/48 |
| | | | | 257/777 |

OTHER PUBLICATIONS

Fazzi, A., et al., "A 0.14mW/Gbps High-Density Capacitive Interface for 3D System Integration," Custom Integrated Circuits Conference, 2005, Proceedings of the IEEE 2005, pp. 101-104, Sep. 18-21, 2005, http://ieeexplore.ieee.org/stamp/stamp.jsp?tp=&arnumber=1568618&isnumber=33245.

Fazzi, A., et al., "3-D Capacitive Interconnections With Mono- and Bi-Directional Capabilities," Solid-State Circuits, IEEE Journal of, vol. 43, No. 1, pp. 275-284, Jan. 2008, http://ieeeexplore.ieee.org/stamp/stamp.jsp?tp=&arnumber=4443187&isnumber=4443178.

Jian Xu, et al., "AC Coupled Interconnect for Dense 3-D ICs," Nuclear Science, IEEE Transactions on, vol. 51, No. 5, pp. 2156-2160, Oct. 2004, http://ieeexploreorg/stamp/stamp.jsp?tp=&arnumber=1344301&isnumber=29603.

Nguyen et al.; "Magnetowetting and Sliding Motion of a Sessile Ferrofluid Droplet in the Presence of a Permanent Magnet"; Langmuir Article; Jun. 18, 2010; pp. 12553-12559; vol. 26, No. 15; American Chemical Society.

* cited by examiner

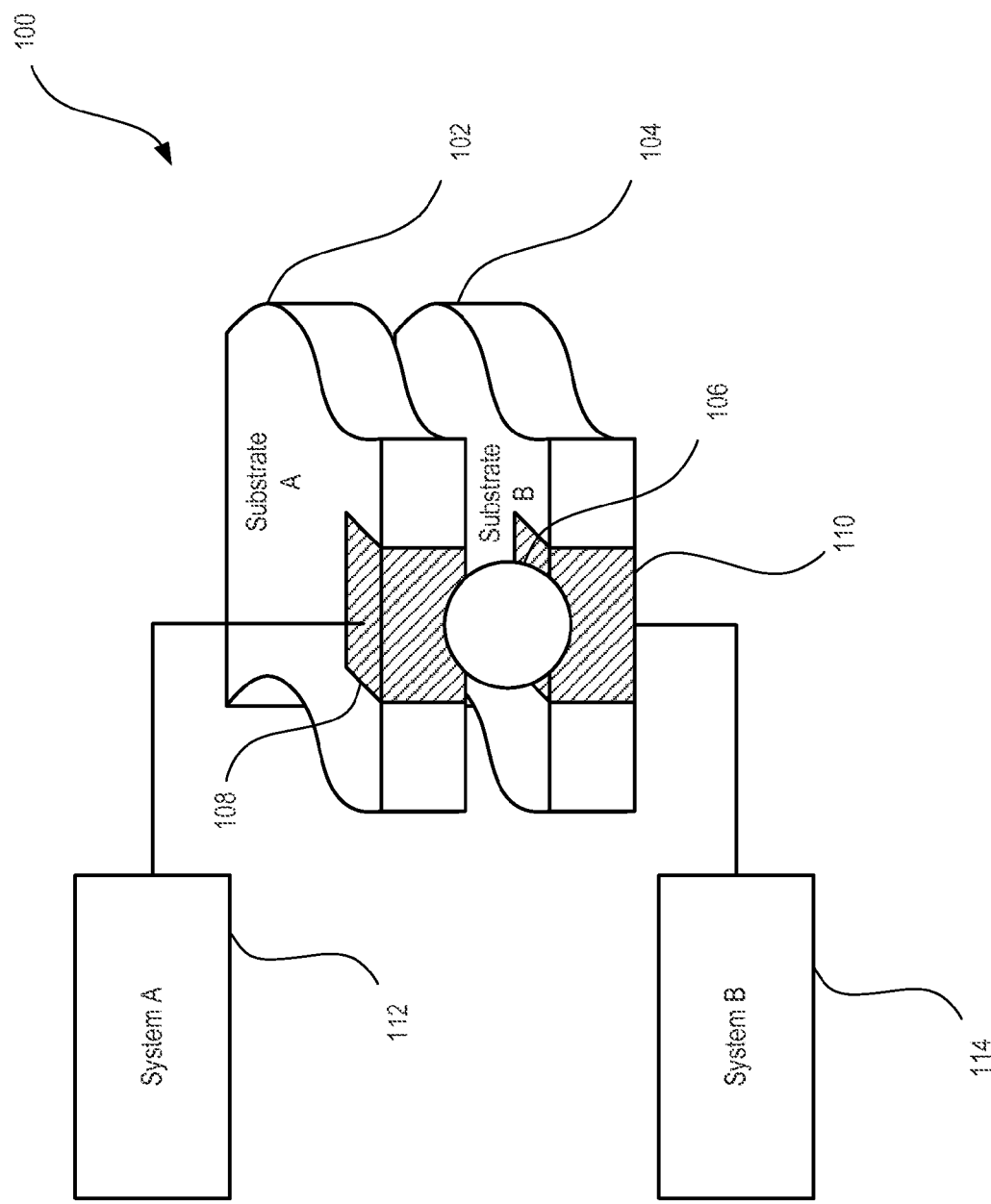

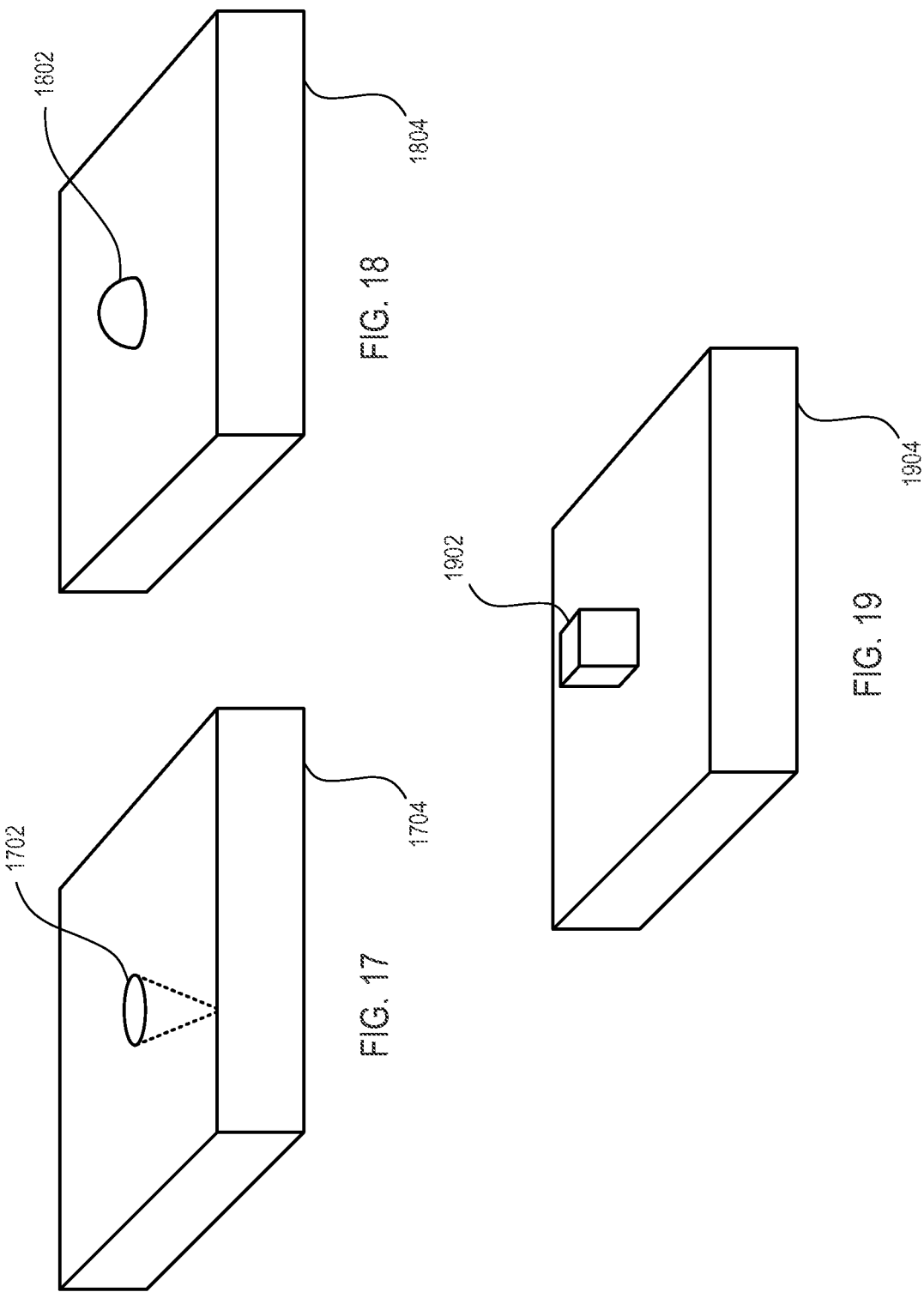

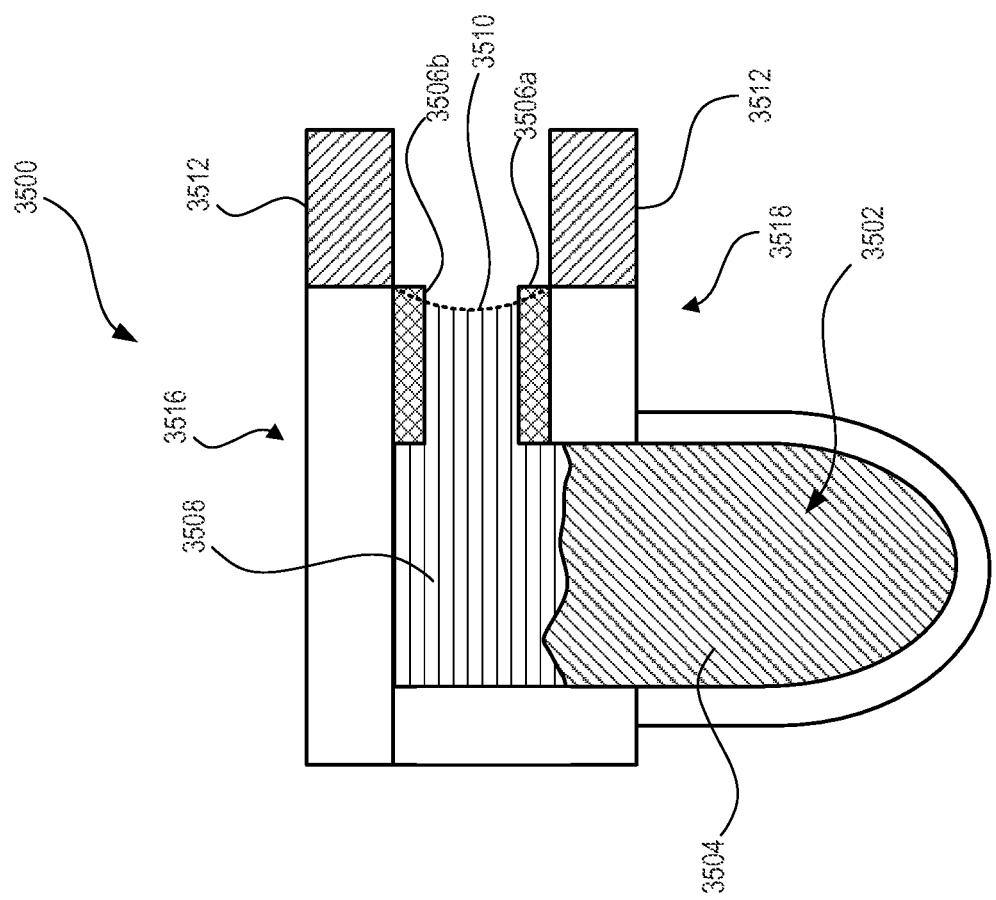
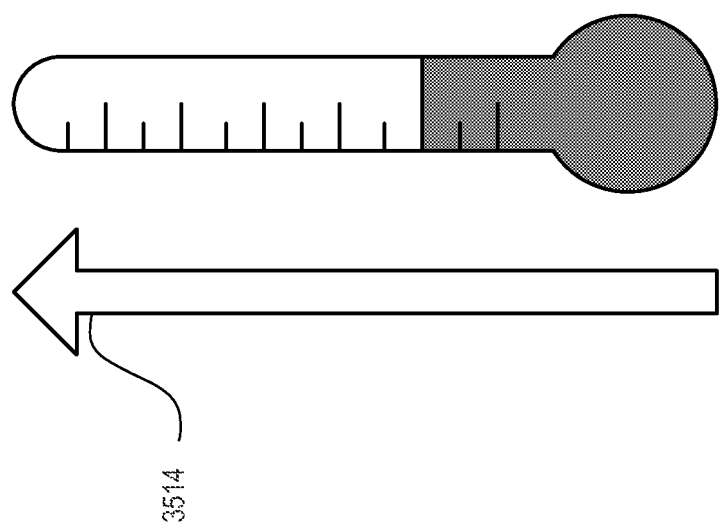
FIG. 35

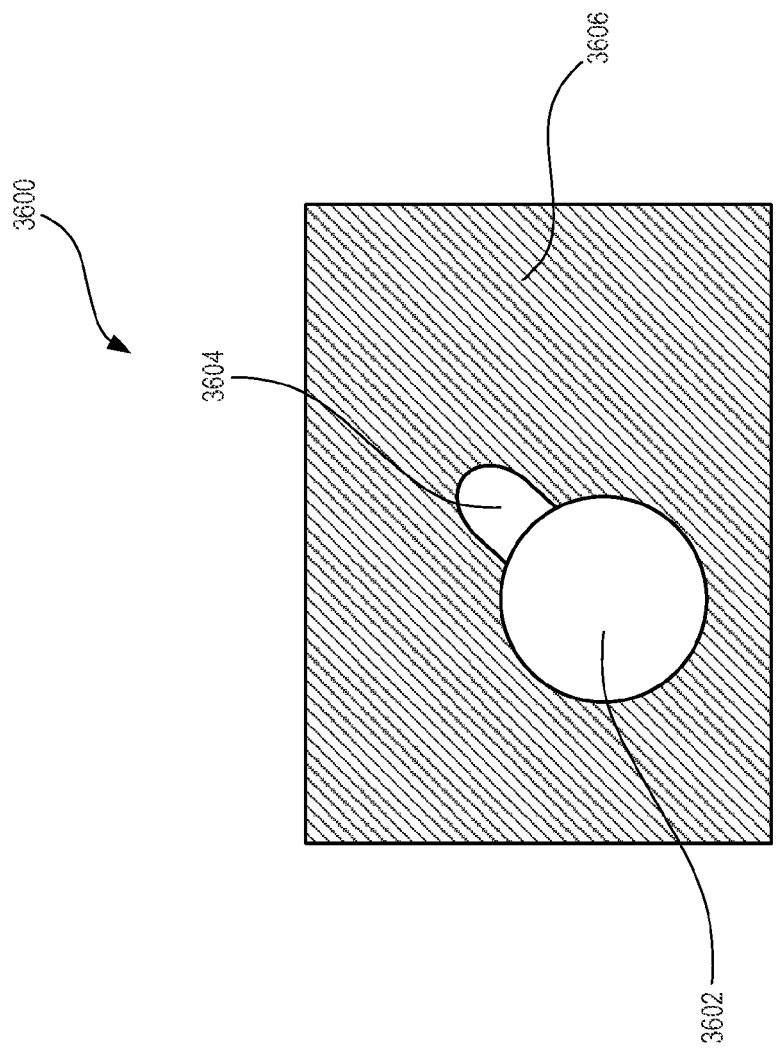
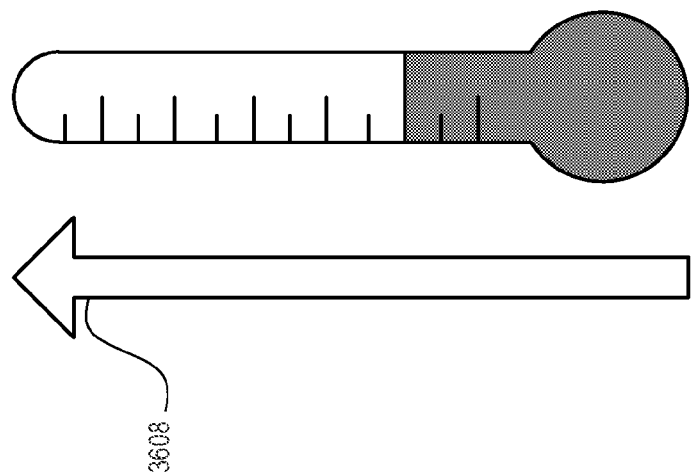
FIG. 36

SYSTEMS, METHODS AND DEVICES FOR INTER-SUBSTRATE COUPLING

If an Application Data Sheet (ADS) has been filed on the filing date of this application, it is incorporated by reference herein. Any applications claimed on the ADS for priority under 35 U.S.C. §§ 119, 120, 121, and/or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 U.S.C. § 119(e) for provisional patent applications, for any and all parent, grandparent, great-grandparent, etc. applications of the Priority Application(s)). In addition, the present application is related to the "Related Applications," if any, listed below.

PRIORITY APPLICATIONS

None

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

TECHNICAL FIELD

The present disclosure relates to inter-substrate coupling and more particularly relates to inter-substrate placement, communication, configuration, and interaction.

BRIEF DESCRIPTION OF THE DRAWINGS

FIG. 1 is a schematic diagram illustrating an inter-substrate coupling system consistent with embodiments disclosed herein.

FIG. 17 is a perspective view of a convex conical substrate feature consistent with embodiments disclosed herein.

FIG. 18 is a perspective view of a convex spherical substrate feature consistent with embodiments disclosed herein.

FIG. 19 is a perspective view of a convex box-shaped substrate feature consistent with embodiments disclosed herein.

FIG. 35 is a diagram of a liquid well on a substrate using temperature to activate a coupling of substrate pads consistent with embodiments disclosed herein.

FIG. 36 is a diagram of a liquid well on a substrate using temperature to activate a coupling using an expansion well consistent with embodiments disclosed herein.

DETAILED DESCRIPTION OF PREFERRED EMBODIMENTS

Figure 2A:
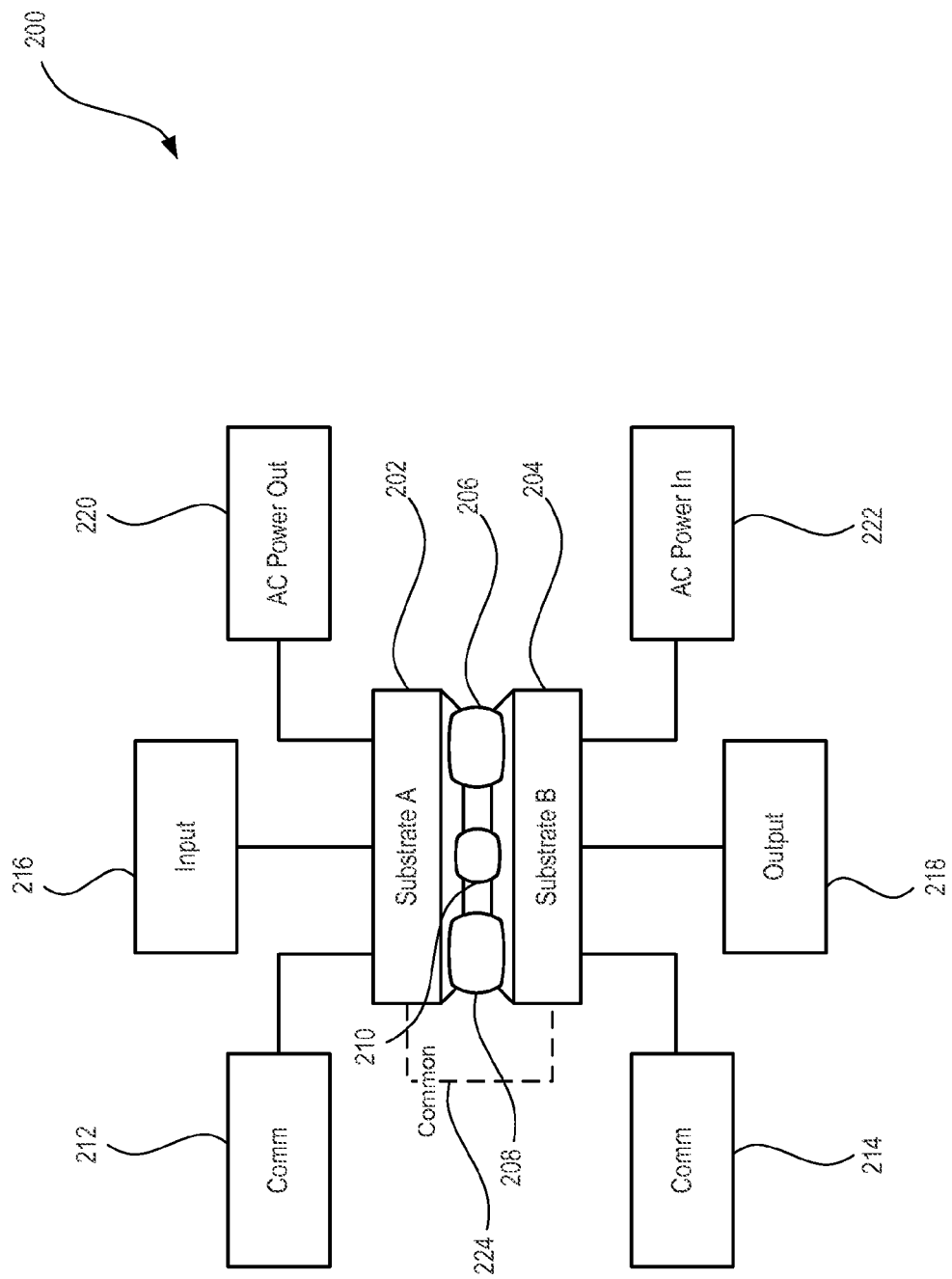
FIG. 2A is a schematic diagram illustrating an inter-substrate coupling system with a configured distance consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Techniques, apparatus, and methods are disclosed that enable inter-substrate coupling using liquid droplets that include electrical and plasmon modalities. For example, a set of droplets can be placed on a bottom substrate. A top substrate can be placed on the droplets, which uses the droplets to align the substrates. Using the droplets in a capacitive or plasmon coupling modality, information or power can be transferred between the substrates using the droplets.

In some embodiments, the droplets can also be moved relative to substrates while the top and bottom substrates are in contact with the droplets. This moving of droplets can switch between circuits on the top and/or bottom substrate. For example, a magnetically sensitive droplet can be placed between the top substrate and the bottom substrate in a first position. The first position can be related to a startup phase of an electronic device. Upon completing the startup phase, the device can use a magnetic field gradient to move the droplet from the first position to a second position that is related to a running phase of the electronic device. By physically moving the droplet, the electronic device can change which circuits are connected and disconnected between the substrates. In some embodiments, the movement of droplets is reversible.

Substrates can include various structures. In some embodiments, substrates can be formed from chips. A chip is a substrate for microelectronics. Chips can be made from silicon or other materials that provide a substrate for microelectronics. In other embodiments, substrates can include structures on multiple sides and/or internal to the substrate. For example, a substrate can include droplet locations on a first side and circuits on a reverse side of the substrate. In another example, a substrate can include droplet locations and circuits on a same side of the substrate. In one example, a substrate can include vias and circuits.

In some embodiments, the droplets can be placed on selected locations on the substrate, while other locations remain empty. These filled locations can represent a configuration between the top substrate and the bottom substrate.

For example, a random access memory (RAM) chip can be configured to communicate with a controller by selectively placing droplets in a subset of locations between the RAM chip (top substrate) and a controller interface (bottom substrate). By using droplets for configuration, a single controller can be configured for various types of RAM chips by selecting which droplets connect the controller to the RAM chip. In addition, the droplets aid in aligning the RAM chip to the controller substrate.

In some embodiments, this capacitive coupling (or "proximity communications") enables extremely wide interconnects between substrates, such as integrated circuits (or chips). These interconnects can be used between CPU chips, between CPU and memory, or between memory chips; they can also allow high-bandwidth communications to or from chips with specialized logic or calculational hardware, including chips using different processing or materials (e.g., chips for microwave or photonic subsystems).

The capacitive coupling can be achieved by non-contact elements and across airgaps. The coupling can use liquid metal contacts across a dielectric. The contacting regions can involve direct chip-to-chip overlaps, side-by-side chips with dedicated interconnection chips (with or without additional processing ability), or overlapped chips (e.g., across edges or corners).

Connection locations can be automatically monitored or adjusted by auto-alignment features. Interconnections can be determined in situ and on-chip switches can be used to dynamically adjust where the datapaths are routed on one/both chips. The connections may also be used to import/export plasmons, or to import/export power.

A proximity communications approach can use non-contacting capacitive interconnects. Coupling can be enhanced by using high permittivity material on one or both sides of the connection. In one embodiment, Curie temperature material is used as part of the connection. In some embodiments the droplet or substrate layers can act as an insulator.

In a first embodiment, self-spacing non-contact interconnects are constructed using liquid droplets. Conductive liquid droplets are placed at discrete locations on a first substrate. A second substrate is positioned so that liquid contacts a dielectric over a conducting pad (or half-capacitor). Surface properties of the dielectric and shapes of one or both surfaces are selected such that surface energy is minimized at a desired (usually nonzero) separation normal to the substrate and at a specific relative position and/or orientation of the substrates.

Optionally, liquid from the liquid droplets can be formed from liquid metal or nonmetallic conductive fluid or non-metallic fluid loaded with conductive particles. The liquid droplets can be located on a first substrate by variations in surface material (e.g., liquid adheres to metal pad), surface texture (e.g., superhydrophobic structures), or surface profile (e.g., pits, bumps). Liquid droplets may have convex profile mating with flat or concave areas on a second substrate, or may have concave profile (e.g., droplet is in a cone or cylinder pit within a first substrate) that mates with bumps or pillars on a second substrate.

Optionally, circuits formed on a substrate may make direct electrical contact with droplets (e.g., via exposed metal pads) or may capacitively couple to droplets. A substrate can optionally be two-sided, with droplets contained in vias (or through-holes) or with pairs of droplets coupled capacitively or coupled by conductors. For example, droplets can be placed on an interlayer between two chips. A liquid metal droplet can chemically react (e.g., form an intermetallic compound) with one or both of the substrates.

Depending on the embodiment, inter-substrate interaction can be performed through single droplets with a common return or through pairs of droplets. In one embodiment, substrates share a common return (e.g. ground) such that a single droplet serve as a conduit for non-contact coupling (e.g. electrical signal, AC power, etc.). In another embodiment, a pair of droplets can provide a differential signal when no common return is available.

Optionally, droplets can be dynamically moved in or out of connection pads that are used to couple substrates. Droplets can be moved through use of electric or magnetic forces. For example, a droplet can be composed of a ferrofluid that is acted upon by magnetic forces. In another example, a liquid metal droplet is acted upon by magnetohydrodynamic (MHD) forces. In yet another example, controllable surface tension can be used for moving droplets (such as via temperature changes).

Optionally, droplets can adhere to one surface more than another can. For example, a droplet can adhere to one surface of a substrate while another substrate remains dry after separation.

Optionally, droplets can be used to provide alignment as well. For example, substrates can have pads configured to receive droplets of different sizes. Large pads for receiving large droplets can be used for coarse positioning. Fine pads for receiving smaller droplets can be used for fine positioning. In some embodiments, coarse droplets and fine droplets can operate sequentially. First, coarse alignment droplets engage between the substrates for coarse alignment of the substrates. Then fine alignment droplets engage between the substrates to provide fine alignment of the substrates. Anti-adherent regions surrounding adherent ones can be optionally used to aid in placing droplets (e.g., to maximize precise alignment of the droplets and/or substrates).

Interconnections can also support non-contact plasmon interconnection. In some embodiments parallel plane conductors or interrupted (e.g., gapped) plasmonic waveguides can be used to couple plasmons through air and/or dielectric material between two adjacent surfaces. Optionally, plasmon interconnection can be used along with capacitive interconnection using the same metallic surface elements or separate conductive elements on the same substrates.

It should be recognized that droplets are discussed in terms of familiar terminology commonly used for describing water droplets for simplicity. However, other liquids (polar or non-polar) can be used besides water. For example, some surfaces described as hydrophobic (having a wetting angle (or contact angle) greater than or equal to 90 degrees) or superhydrophobic (having a wetting angle (or contact angle) greater than 150 degrees) can also be created as lyophobic, superlyophobic, omniphobic, or superomniphobic surfaces, depending on the droplet material selected. Similarly, some surfaces described as hydrophilic (having a wetting angle (or contact angle) less than or equal to 90 degrees) or superhydrophilic (having a wetting angle (or contact angle) less than 5 degrees) can also be created as lyophilic, superlyophilic, omniphilic or superomniphilic surfaces, depending on the droplet material selected.

It should be recognized that embodiments discussed herein have been limited to coupling two substrates for the purposes of simplicity and clarity. However, multiple substrates can be coupled. In one example, two substrates overlap over a single substrate. In another example, a substrate can serve as an interlayer. In an example, substrates can be coupled in different directions (e.g., a top substrate and a side substrate). In some embodiments, substrates can also be removable and a replaced by another substrate. In one embodiment, a first substrate can be configured to retain droplets when removed from a second substrate, such that a new substrate can be placed on the retained droplets. In other embodiments, the substrates are single use and cannot be recoupled.

It should be recognized that chips, such as integrated chips, can include circuits, multi-chip modules and other substrates that can be coupled together. It should also be recognized that droplets can include forms of liquids including drops, drips, condensations, etc.

FIGS. 1 and 2 show examples of systems that use droplets as non-contact couplings between systems. FIG. 1 shows an example of a single droplet in a larger system. FIG. 2 shows use of several droplets to aid in positioning and coupling.

FIG. 1 is a schematic diagram illustrating inter-substrate coupling system 100. Inter-substrate coupling system 100 includes two substrates 102 and 104 with liquid droplet 106 between coupling elements 108 and 110. Using liquid droplet 106, coupling elements 108 and 110 enable non-contact electrical or plasmon passage between substrates 102 and 104. This passage allows connections between system A (112) and system B (114) without direct electrical or plasmon contact. These connections can be used for communication, power transfer, or digital or analog signals.

In one embodiment, a droplet can be placed on substrate 104. Substrate 102 can then be placed upon droplet 106, with droplet 106 contacting substrate 104 and substrate 102 on coupling elements 106 and 108. Droplet 106 can be formed from a dielectric compound (e.g., transformer fluid). Coupling elements 108 and 110 can be formed from low resistance contacts (e.g., metal) to form a capacitor with droplet 106. This capacitor can allow non-contact communication between systems 112 and 114 using substrates 102 and 104 through droplet 106.

For example, substrate 104 can be part of a memory controller. Substrate 102 can be part of a memory chip. By placing droplet 106 between substrates 102 and 104, the controller can have a communication channel with a memory chip without making contact.

In one embodiment, droplet 106 can be placed on substrate 104. Substrate 102 can then be placed upon droplet 106, with droplet 106 contacting substrate 104 and substrate 102 on coupling elements 106 and 108. Droplet 106 and coupling elements 108 and 110 can form a plasmon interconnection (e.g., interrupted plasmonic waveguide, parallel plane conductors, etc.). This plasmon interconnection can allow non-contact plasmon communication between systems 112 and 114 using substrates 102 and 104 through droplet 106.

Figure 2B:
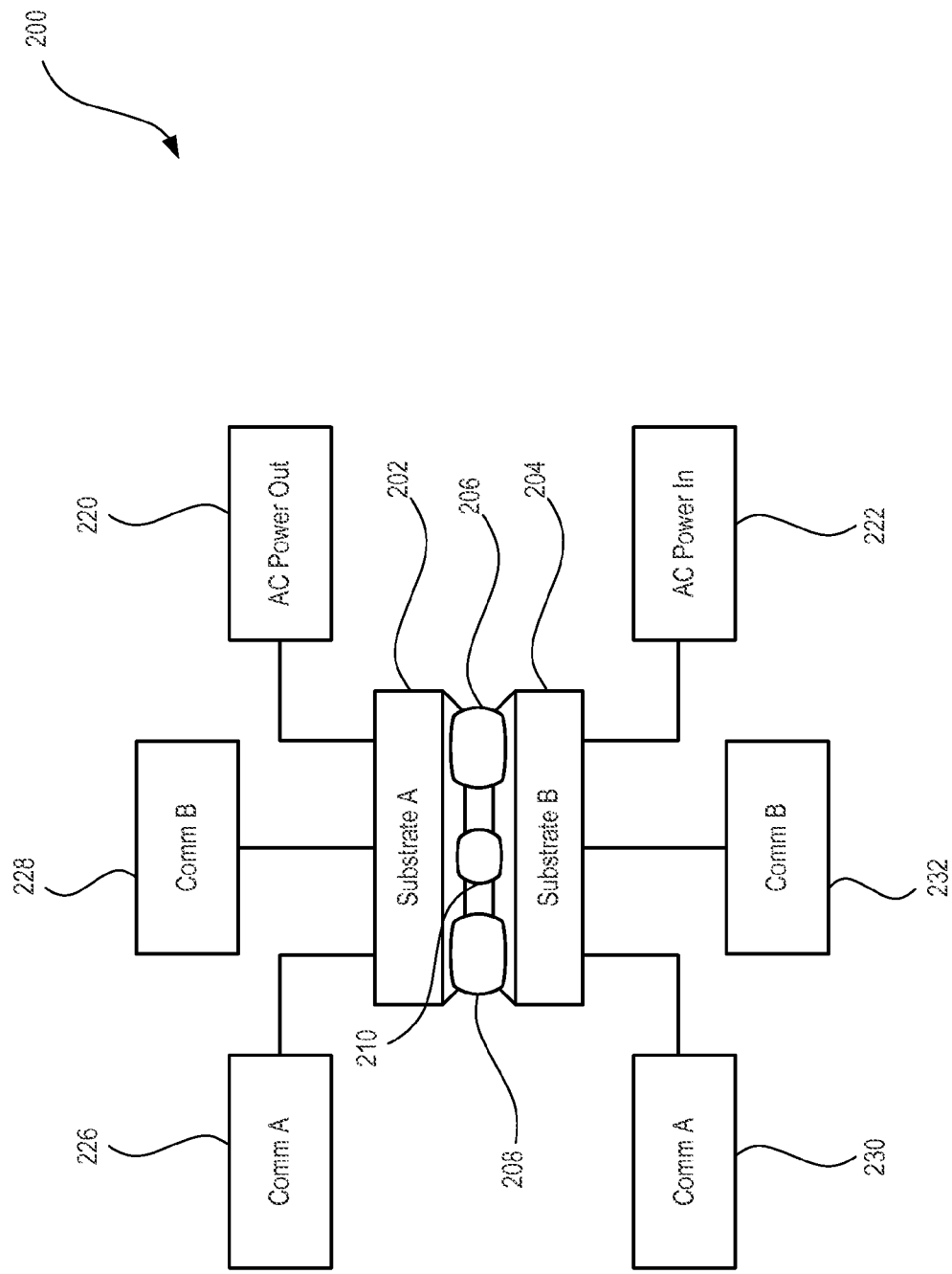
FIG. 2B is a schematic diagram illustrating an alternate inter-substrate coupling system with a configured distance consistent with embodiments disclosed herein.

FIGS. 2A and 2B are schematic diagrams illustrating inter-substrate coupling systems 200 with a configured distance. FIG. 2A shows a set of substrates 202 and 204 with a common return 224. FIG. 2B shows a set of substrates 202 and 204 using differential communication.

In both embodiments shown, when multiple droplets 206, 208, and 210 are used together, substrates 202 and 204 can be aligned and separated by a defined distance. Some or all of droplets 206, 208, and 210 can be used in coupling electrical or plasmon connections between substrates 202 and 204.

Surface properties of droplets 206, 208, and 210 and substrates 202 and 204 in conjunction with substrate shapes can define tolerances of separation between substrates 202 and 204. By placing droplets 206, 208, and 210 at discrete locations on substrate 202, matching discrete locations on substrate 204 can be placed on droplets 206, 208, and 210. Use of at least three droplets 206, 208, and 210 can define a distance between substrates 202 and 204. The three droplets 206, 208, and 210 define a first surface that contacts substrate 202 and a second surface that contacts substrate 204. Surface tension of droplets 206, 208, and 210 can act to keep substrates 202 and 204 separated.

In addition to the vertical separation of substrates, droplets 206, 208, and 210 can act upon substrates 202 and 204 to define an orientation (e.g., rotation angle, horizontal translation) of substrates 202 and 204. Surface tension of droplets 206, 208, and 210 can act to pull (or push) matching surface locations of substrates 202 and 204 into rotational and horizontal alignment (see, e.g., FIG. 10).

In an embodiment, substrates 204 and 202 are configured with aligned receptacles for droplets (see, e.g., FIGS. 13-19). Droplets 206, 208, and 210 are placed on the receptacles of substrate 204. Substrate 202 is placed on droplets 206, 208, and 210. Due to the receptacles of substrate 202, surface tension of droplets 206, 208, and 210 cause receptacles of substrate 202 to settle and align over substrate 204. Depending on the embodiment, one or more of droplets 206, 208, and 210 can be used in electrically coupling substrates 202 and 204. Remaining droplets from 206, 208, and 210 can serve solely to aid in alignment.

In one embodiment, multiple droplets 206, 208, and 210 are used in an electrical connection between substrates 202 and 204. Droplets 206, 208, and 210 can form capacitors in conjunction with substrates 202 and 204. These capacitors can couple signals, digital or analog signals, and power between substrates 202 and 204.

For example, droplets 206, 208, and 210 can be formed from dielectric material. Substrates 202 and 204 can include individual pads for droplets 206, 208, and 210, which together form individual capacitors. Communication signals can be passed between communication systems 212 and 214 using a capacitor that includes droplet 208. Digital or analog signals can be passed between output 218 and input 216 using a capacitor that includes droplet 210. AC power can be sent by AC power output 220 to AC power input 222 and between substrates 202 and 204 using a capacitor that includes droplet 206. In some embodiments, AC power may be in the megahertz or gigahertz frequency range.

In another embodiment, one droplet 206 is used in an electrical connection between substrates 202 and 204. For example, droplet 206 can form a capacitor in conjunction with substrates 202 and 204. Droplets 208 and 210 can be used solely for alignment, while droplet 206 can be used for alignment and electrical coupling between substrates 202 and 204. The capacitor formed by droplet 206 with substrates 202 and 204 can couple AC power from AC power output 220 to AC power input 222. In some embodiments, droplet 206 instead forms a gapped plasmon waveguide between substrates 202 and 204, allowing plasmon communication between substrates 202 and 204.

In one embodiment, multiple droplets 206, 208, and 210 are used in coupling between substrates 202 and 204 using both plasmon and electrical modalities. Droplets 206, 208, and 210 can form capacitors in conjunction with substrates 202 and 204. These capacitors can couple signals, digital or analog signals, and power between substrates 202 and 204. In addition, droplet 206 with substrates 202 and 204 can create a gapped plasmon waveguide to provide a return signal between AC power input 222 and AC power output 220.

For example in FIG. 2A, droplets 206, 208, and 210 can be formed from dielectric material. Substrates 202 and 204 can include individual pads for droplets 206, 208, and 210, which together form individual capacitors. Communication signals can be passed between communication systems 212 and 214 using a capacitor that includes droplet 208. Digital or analog signals can be passed between output 218 and input 216 using a capacitor that includes droplet 210. AC power can be sent by AC power output 220 to AC power input 222 and between substrates 202 and 204 using a capacitor that includes droplet 206. An AC control signal can be passed back using a gapped plasmon waveguide from AC power input 222 to AC power output 220, allowing control of the AC power supply.

For example in FIG. 2B, droplets 206, 208, and 210 can be formed from dielectric material. Substrates 202 and 204 can include individual pads for droplets 206, 208, and 210, which together form individual capacitors. Communication signals can be passed between communication systems using capacitors that includes droplet 208 and 210 for differential communications. Comm A 226 and 230 can be compared against Comm B 228 and 232 to determine a difference (e.g. a difference in voltage). The difference can be used to indicate binary or sometimes larger values.

While vertical separations, horizontal separations, and rotational orientations were discussed with regard to substrates, it should be recognized that other separations and orientations can be used depending on the placement of droplets and orientations of substrate surfaces. For example, two substrates can be placed side by side with three (or more) droplets in between. The droplets can then define two vertical surfaces that define the separation between substrates. The surface tension of the droplets can encourage (e.g., pull) the two substrates to align (rotationally and in a plane defined by up/down and depth) the substrates to minimize surface tension.

Figure 3:
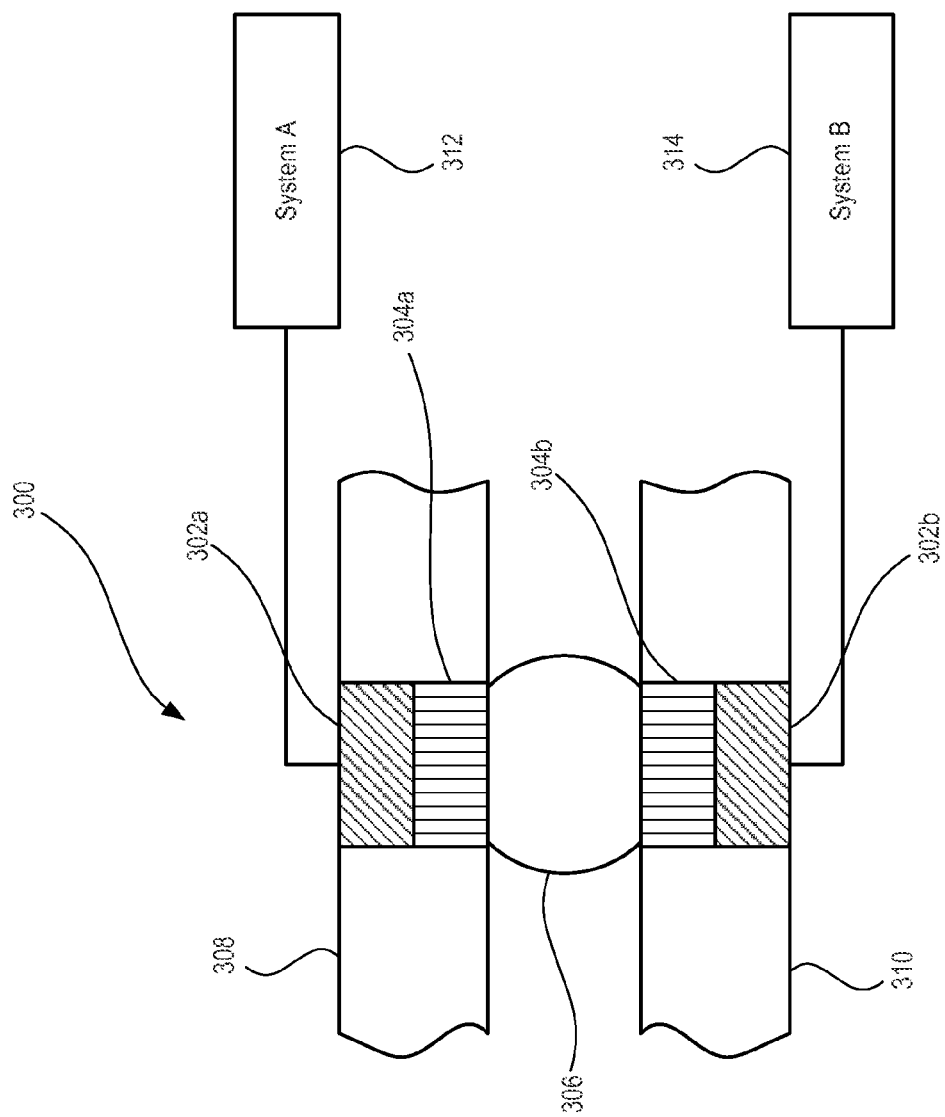
FIG. 3 is a cut-away view of a two-layer interconnect consistent with embodiments disclosed herein.
Figure 4:
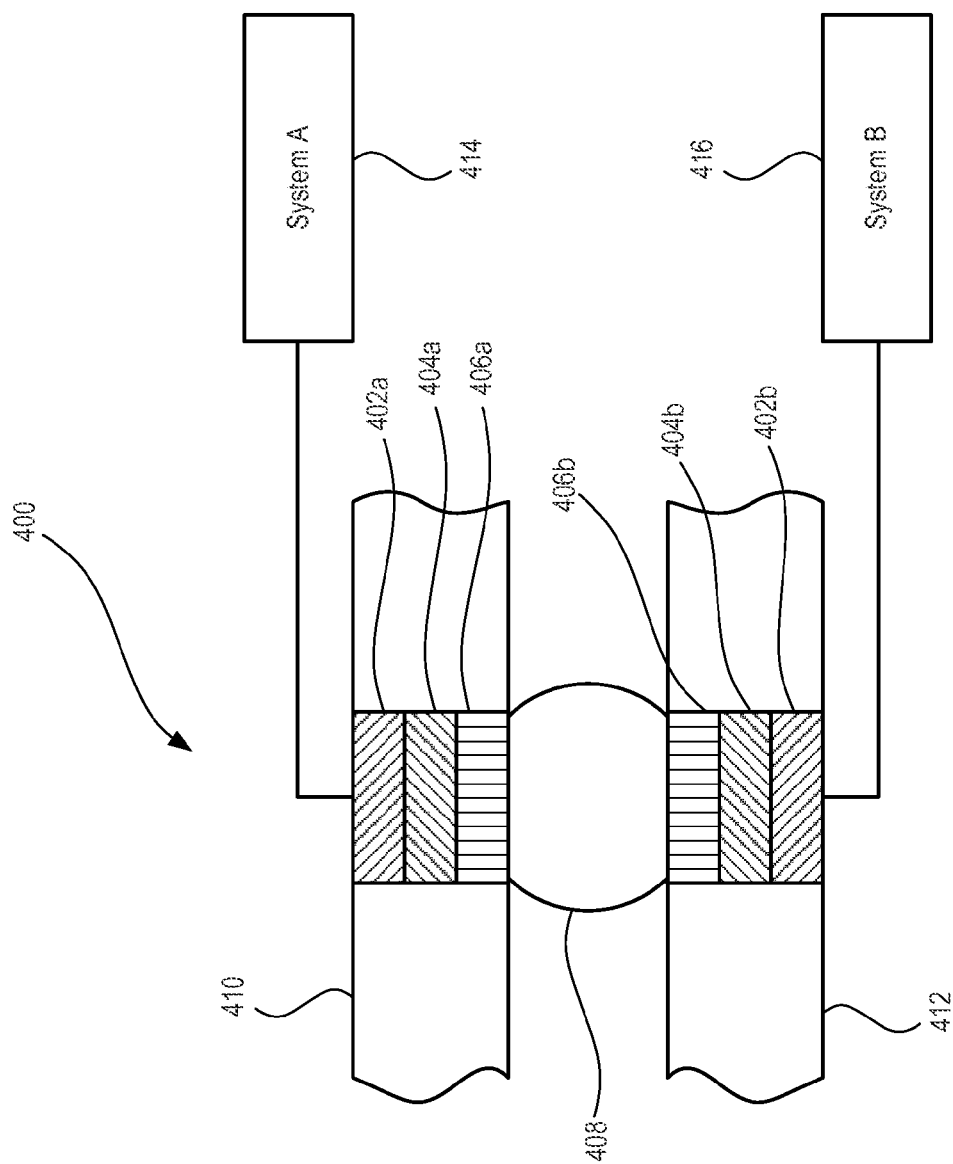
FIG. 4 is a cut-away view of a three-layer interconnect consistent with embodiments disclosed herein.
Figure 5:
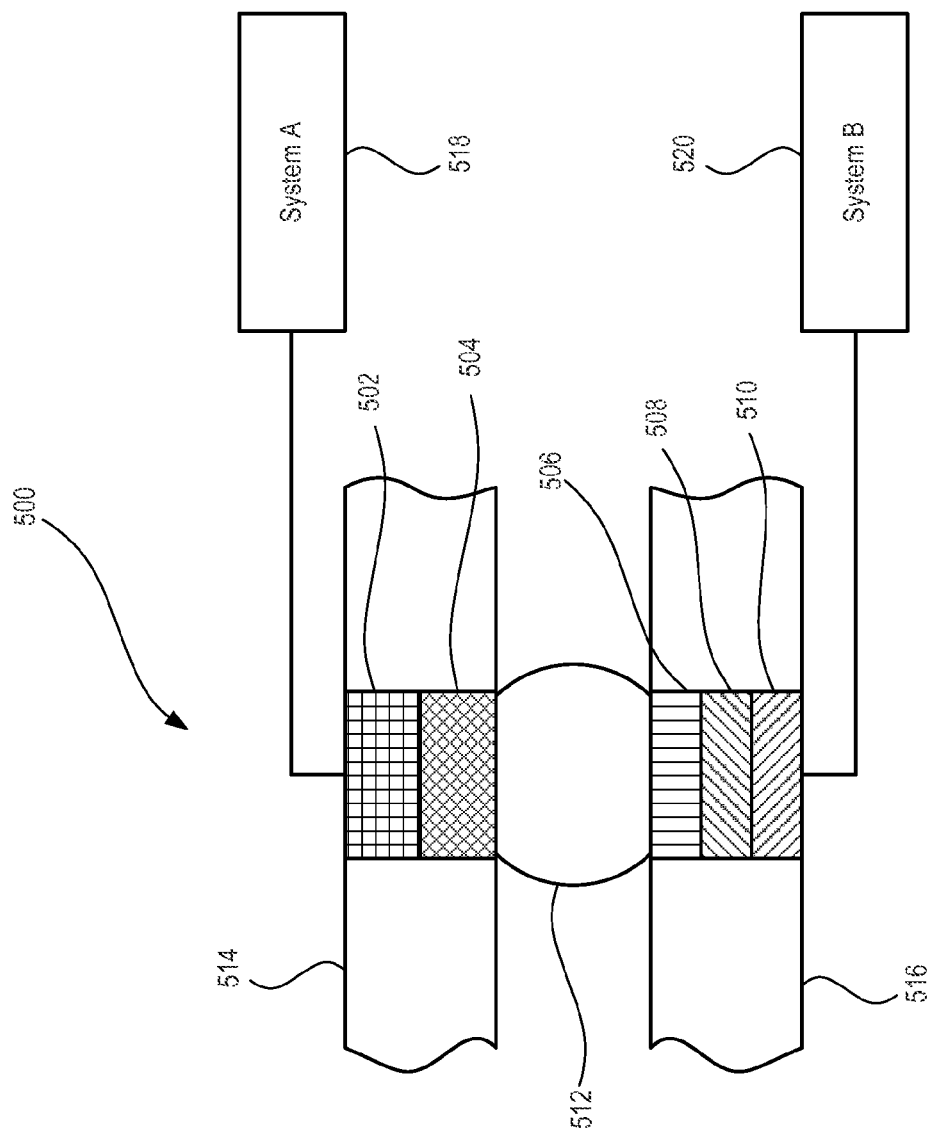
FIG. 5 is a cut-away view of a mixed-layer interconnect consistent with embodiments disclosed herein.

FIGS. 3-5 show various configurations of droplet-substrate contact configurations. FIG. 3 shows a two-layer substrate contact configuration. FIG. 4 shows a three-layer substrate contact configuration. FIG. 5 shows a mixed two- and three-layer substrate contact configuration. It should be recognized that these configurations are examples and that other layered configurations are possible (e.g., a single-layer configuration as show in FIG. 1, etc.).

FIG. 3 is a cut-away view of a two-layer interconnect. In the embodiment shown, droplet 306 is in physical contact with pad 304a of substrate 308 and pad 304b of substrate 310. Layer 302a of substrate 308 sits between pad 304a and system A 312. Layer 302b of substrate 310 sits between pad 304b and system B 314.

In one embodiment, layers 304a and 304b are conductive pads (e.g., metal) and layers 302a and 302b are dielectric layers. The combination of the conductive pads and dielectric material make system 300 a capacitor that transmits electrical energy without direct electrical contact (or non-contact transmission).

For example, system A 312 can transmit an electrical signal to a plate on layer 302a. As a dielectric, an oscillating electrical field passes through layer 302a, but electrons do not. The electrical field causes electrons to migrate to/from layer 304a through droplet 306 from/to layer 304b. This causes a corresponding electrical field across the dielectric layer 302b. This electric field causes electrons to flow to/from system B 314. Without electrical contact, a signal can be passed from system A 312 to system B 314 through a capacitor that includes droplet 306.

In some embodiments, droplet 306 can bond with one or both of substrates 308 and 310. Droplet 306 can chemically react (e.g., form an intermetallic compound) when exposed to layers 304a and/or 304b.

In another embodiment, layers 302a and 302b are conductive pads and layers 304a and 304b are dielectric pads. Layers 304a and 304b in conjunction with droplet 306 act as a dielectric in a capacitor that further includes layers 302a and 302b. The capacitor formed by system 300 can pass signals and/or AC electrical energy between systems 312 and 314.

In some embodiments, layers 302a, 302b, 304a, and 304b are conductive, while droplet 306 is a dielectric. Layers 304a and 304b can be configured to be hydrophilic or superhydrophilic to attract droplet 306 to the areas of layers 304a and 304b. Optionally, the remaining portions of substrates 308 and 310 can be hydrophobic or superhydrophobic. By having hydrophilic and/or hydrophobic areas, droplet 306 can be limited to the areas defined by layers 304a and 304b (e.g., by surface tension). Layers 302a, 302b, 304a, and 304b can form a capacitor in conjunction with dielectric droplet 306. This capacitor allows a non-contact connection to be formed between system A 312 and system B 314.

FIG. 4 is a cut-away view of a three-layer interconnect. In the embodiment shown, droplet 408 is in physical contact with pad 406a of substrate 410 and pad 406b of substrate 412. Layer 404a sits between pad 406a and layer 402a. Layer 404b sits between pad 406b and layer 402b. Layer 402a of substrate 410 sits between layer 404a and system A 414. Layer 402b of substrate 412 sits between layer 404b and system B 416.

In one embodiment, layers 406a and 406b are hydrophilic conductive pads that attracts conductive droplet 408. Layers 404a and 404b are dielectric layers. Layers 402a and 402b are conductive layers. Layers 402a, 404a, and 406a form a first capacitor. Layers 402b, 404b, and 406b form a second capacitor. Conductive droplet 408 forms an electrical path between the first and second capacitors. A non-contact electrical link is formed between system A 414 and system B 416 through the first and second capacitors in conjunction with droplet 408.

In another embodiment, layers 406a and 406b are hydrophilic pads that attract dielectric droplet 408. Depending on the embodiment, layers 406a and 406b can be or are not dielectric. Layers 404a and 404b form capacitive plates. The capacitive plates, droplet 408, and layers 406a and 406b form a capacitor that allows for non-contact communication between system A 414 and system B 416. Layers 402a and 402b can form conductive paths (e.g., traces) to other system components.

In another embodiment, layers 406a and 406b are hydrophilic dielectric pads that attract conductive droplet 408. Layers 404a and 404b can be conductive plates that form a capacitive connection between substrates 410 and 412 in conjunction with layers 406a and 406b and droplet 408. Layers 402a and 402b can form conductive paths (e.g., traces) to other system components.

In an embodiment, substrates 410 and 412 with droplet 408 form a non-contact plasmon connection. Layers 406a and 406b are hydrophilic pads that attract droplet 408. Layers 404a, 404b, 406a, and 406b form a gapped plasmon waveguide that can transfer plasmons from layer 402a to layer 402b. System B 416 can detect transferred plasmons from system A 414 through the gapped plasmon waveguide.

In one embodiment, substrates 410 and 412 are hydrophobic (or superhydrophobic) except at least layers 406a and 406b. Surface tension causes droplet 408 to settle between layers 406a and 406b. Droplet 408 and layers 406a, 406b, 402a, and 402b can be conductive. Layers 402a, 404a, and 406a form a first capacitor. Layers 402b, 404b, and 406b form a second capacitor. Conductive droplet 408 forms an electrical path between the capacitors.

FIG. 5 is a cut-away view of a mixed-layer interconnect 500. Each substrate 514 and 516 can be designed to operate in conjunction with specifications specific to systems or environments. In some embodiments, this can result in a capacitive side and a conductive side.

In the embodiment shown, droplet 512 is in physical contact with pad 504 of substrate 514 and pad 506 of substrate 516. Layer 508 sits between pad 506 and layer 510. Pad 504 is in contact with layer 502. Layer 502 of substrate 514 sits between pad 504 and system A 514. Layer 510 of substrate 516 sits between layer 508 and system B 520.

In one embodiment, substrate 516 has a capacitive connection to droplet 512 and substrate 514 has a conductive connection to droplet 512. Layers 504 and 502 are conductive paths to system A 518. Layer 508 and droplet 512 can be formed from dielectric material. Layers 506 and 510 can be formed from conductive material. A first capacitor is formed by layers 506, 508, and 510. A second capacitor is formed by layers 504 and 506 and droplet 512. Electrical signals and/or AC power can pass through the first and second capacitors between system A 518 and system B 520. Other mixed configurations and combinations are possible, such as layer descriptions described in conjunction with FIGS. 3 and 4.

Figure 6:
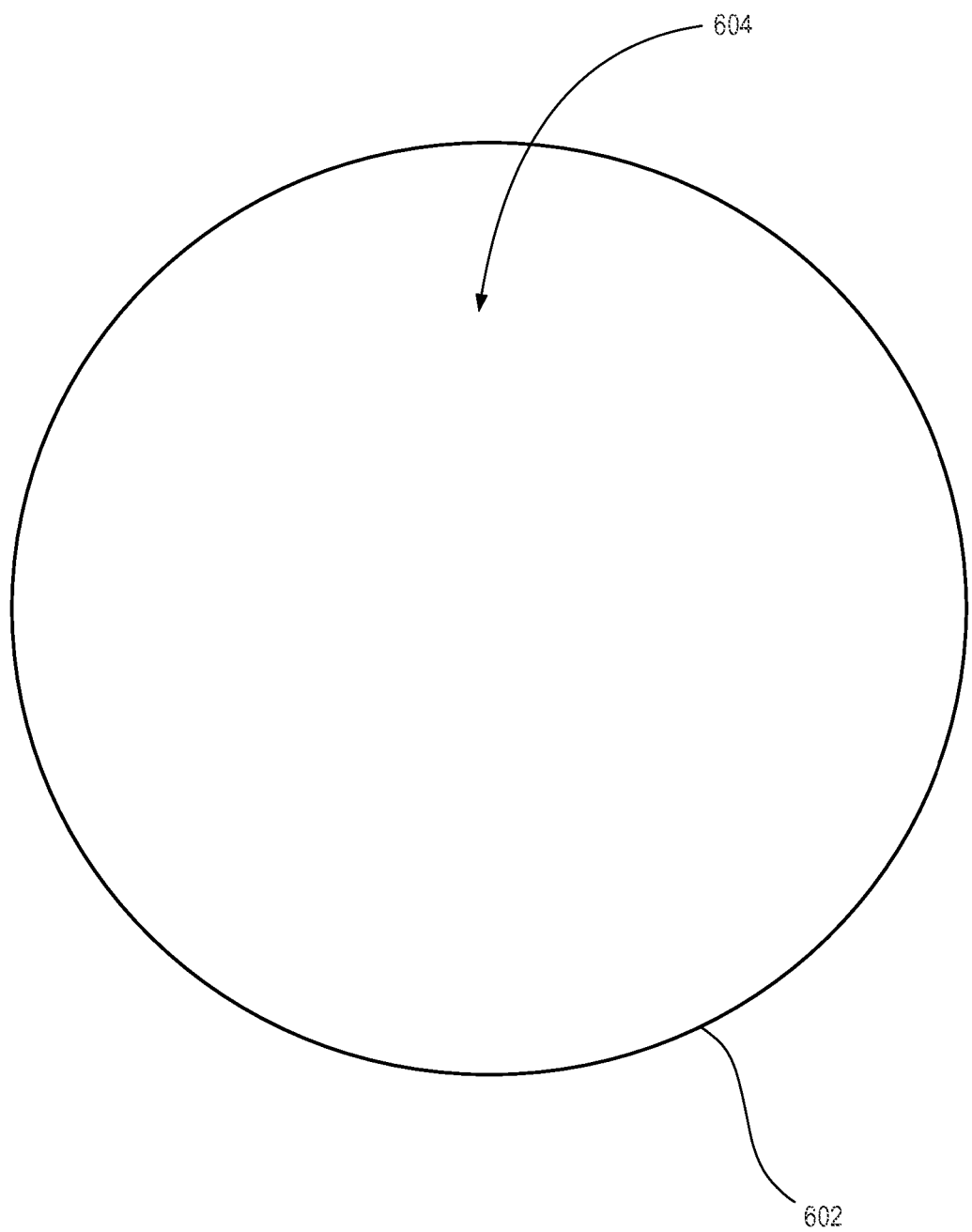
FIG. 6 is a front view of a heterogeneous droplet consistent with embodiments disclosed herein.
Figure 7:
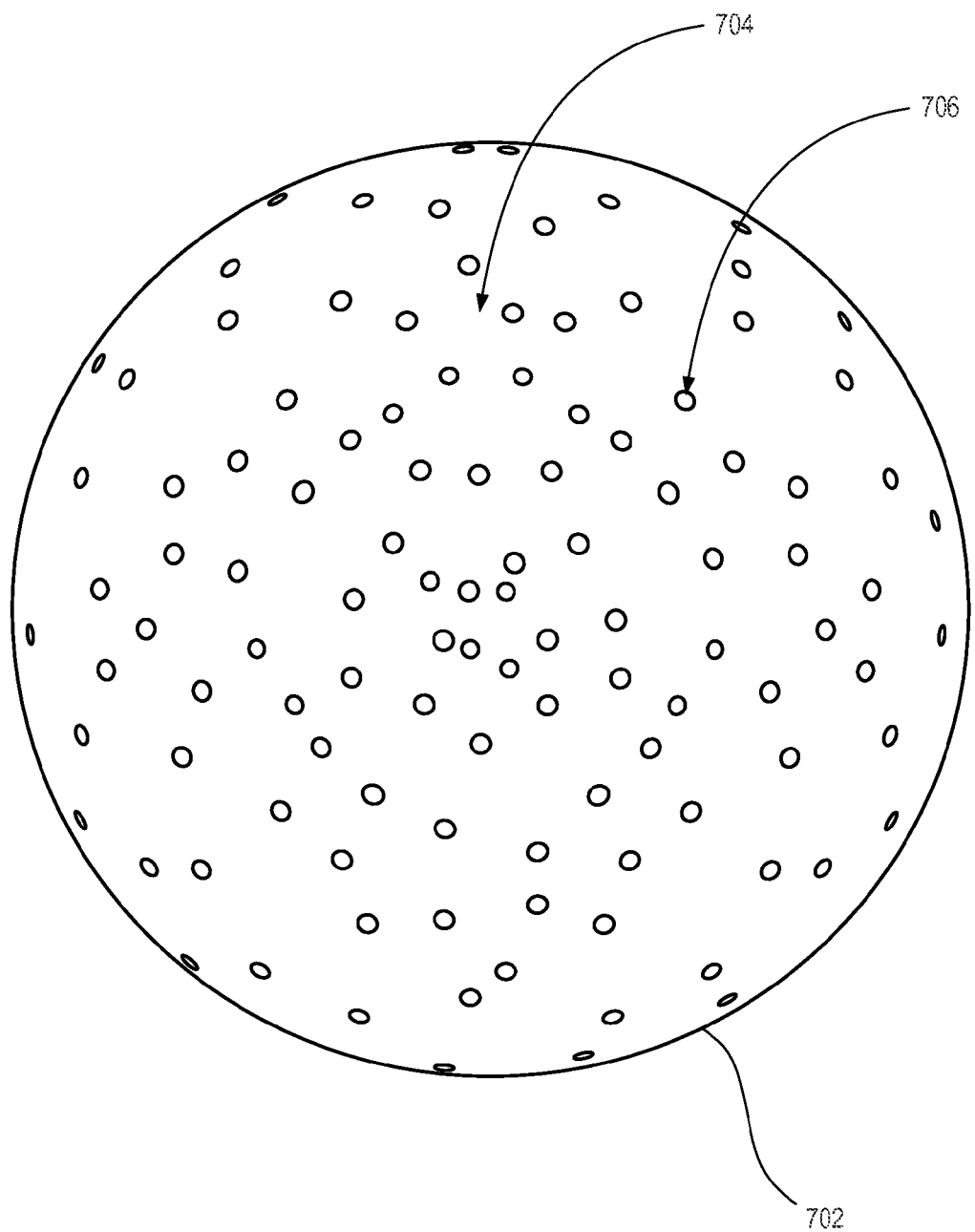
FIG. 7 is a front view of a droplet with suspended particles consistent with embodiments disclosed herein.

FIGS. 6 and 7 show potential compositions of droplets, although other compositions are possible. FIG. 6 is a front view of a heterogeneous droplet. FIG. 7 is a front view of a droplet with suspended particles. Droplets can be configured with properties that allow for predicted behavior. For example, droplets can be configured such that a wetting angle is known with respect to substrate surfaces. In another example, droplets can be configured with properties that react to electric field gradients, magnetic field gradients, or temperature (including temperature gradients). Droplets can also be configured to be limited to defined surfaces on a substrate.

In some embodiments, droplets can respond to other stimuli as well. In one embodiment, a photosensitive droplet can be made conductive when light is shined upon it (which can be generally reactive, frequency specific or reactive to a range of frequencies). In another embodiment, a droplet can become magnetically sensitive when exposed to a gas (e.g. chemically react, absorb gas particles, etc.). In another embodiment, a droplet can become hydrophilic to a surface after exposure to light and/or gas (for which the droplet was previously hydrophobic. Other sensitivities and/or combinations can be possible.

Some droplets 602, as shown in FIG. 6 can be homogeneous, whether including a single material or dissolved materials. Droplet material 604 can be polar or non-polar. Droplet material 604 can be composed from mixtures that include water, oil, metals, alloys, or other liquid or liquid-like substances (e.g., gels). For example, droplet 602 can be formed from dielectric oil (e.g., as used in capacitors). In some embodiments, droplet 602 can be formed from low melting metals including mercury, gallium, alloys of mercury, alloys of gallium and/or other low melting alloys.

Other droplets 702, as shown in FIG. 7, can be heterogeneous. In the embodiment shown, particles 706 can be suspended in liquid 704. In some embodiments, nanoparticles can be suspended in a liquid. In other embodiments, a colloid can be used. Particles can be configured to provide specific characteristics to droplet 702. For example, an inert droplet 702 can be loaded with magnetically reactive nanoparticles, to allow droplet 702 to react to magnetic field gradients. In another example, particles 706 can be added to droplet 702 to alter dielectric properties of droplet 702 (e.g., aid in making a more efficient capacitor, adjust breakdown voltage, adjust capacitance, etc.). In one example, particles 706 can be added to inert droplet 702 to make droplet 702 conductive to electric energy.

Figure 8:
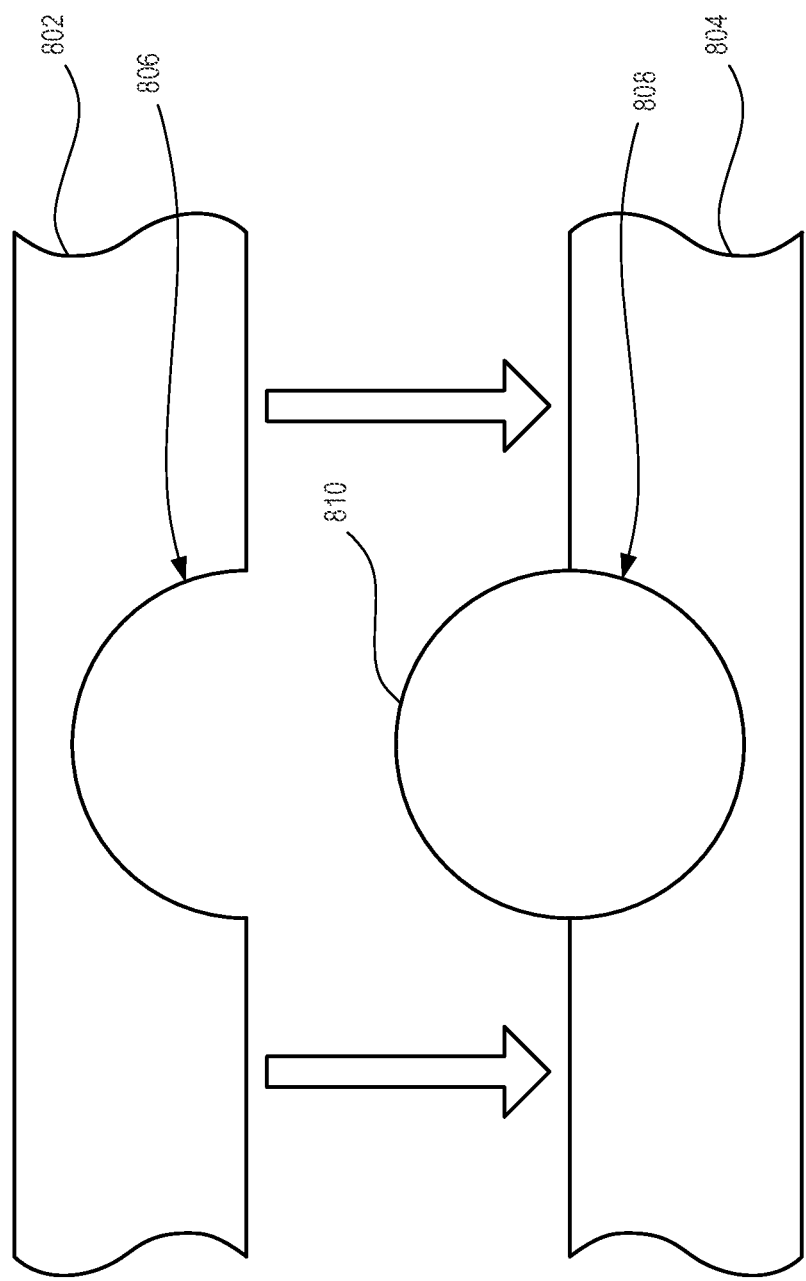
FIG. 8 is a cross-section view of two substrates with concave profiles consistent with embodiments disclosed herein.
Figure 9:
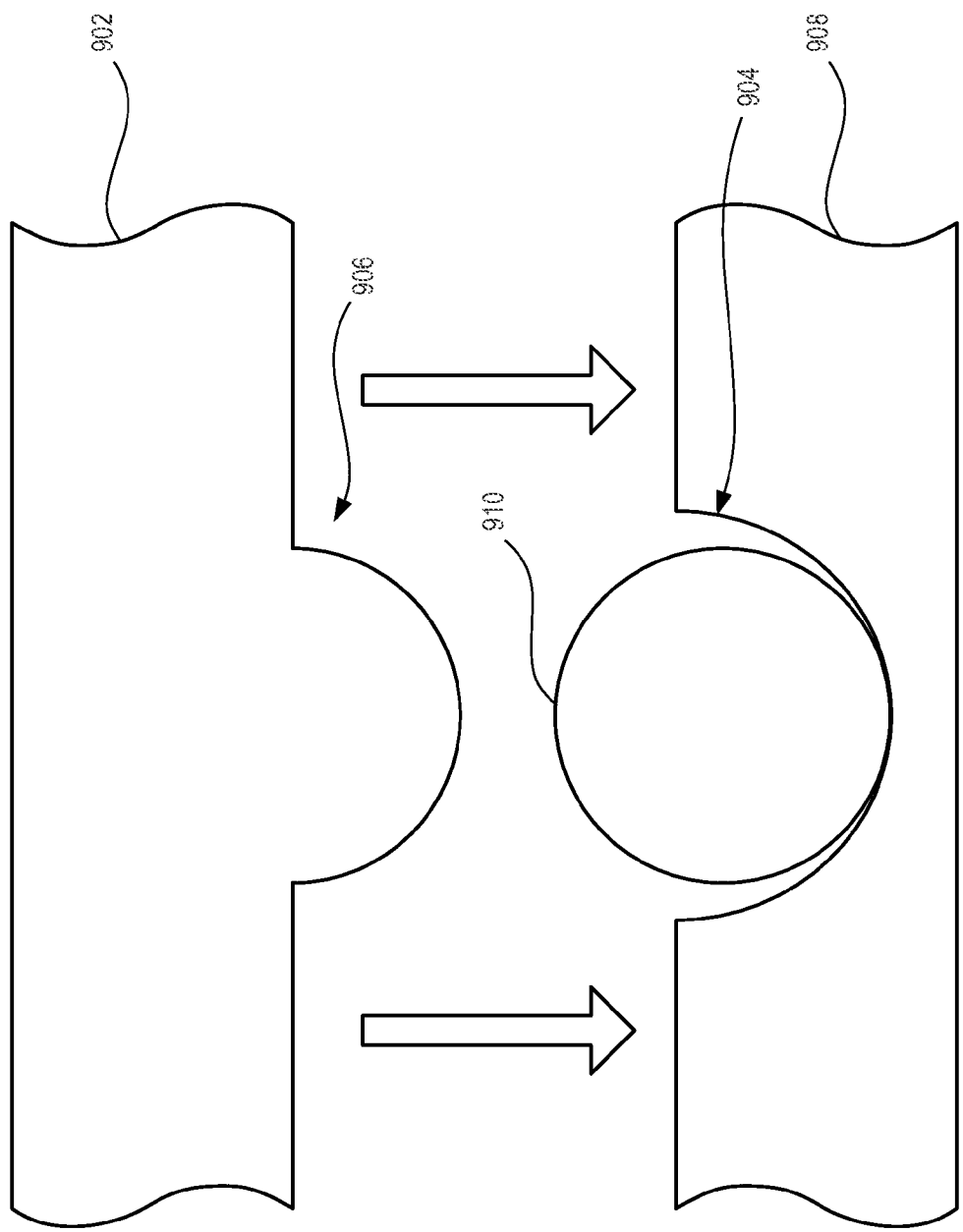
FIG. 9 is a cross-section view of a first substrate with a concave profile and a second substrate with a convex profile consistent with embodiments disclosed herein.
Figure 10:
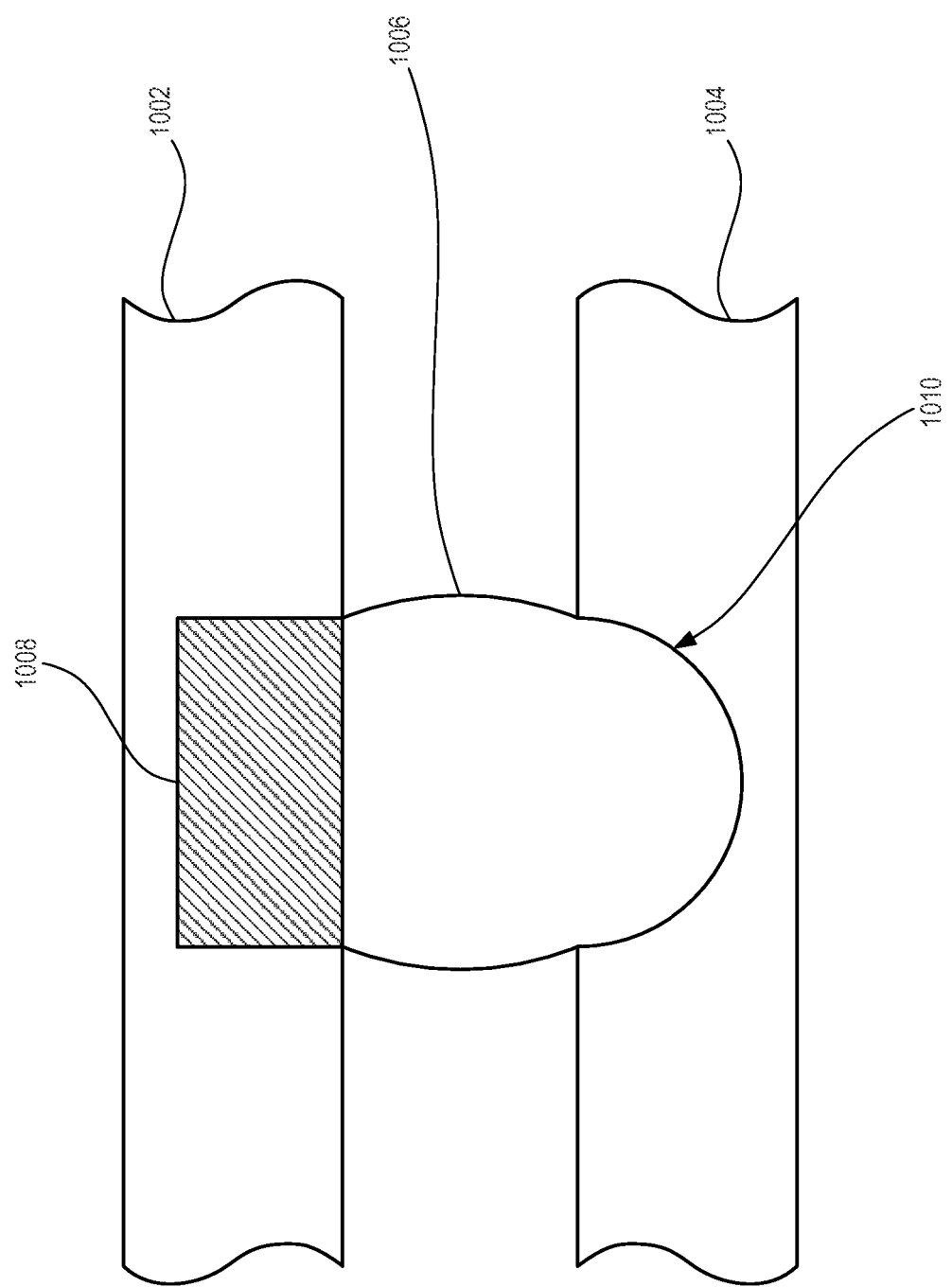
FIG. 10 is a cross-section view of a first substrate with a concave profile and a second substrate with a hydrophilic surface consistent with embodiments disclosed herein.
Figure 11:
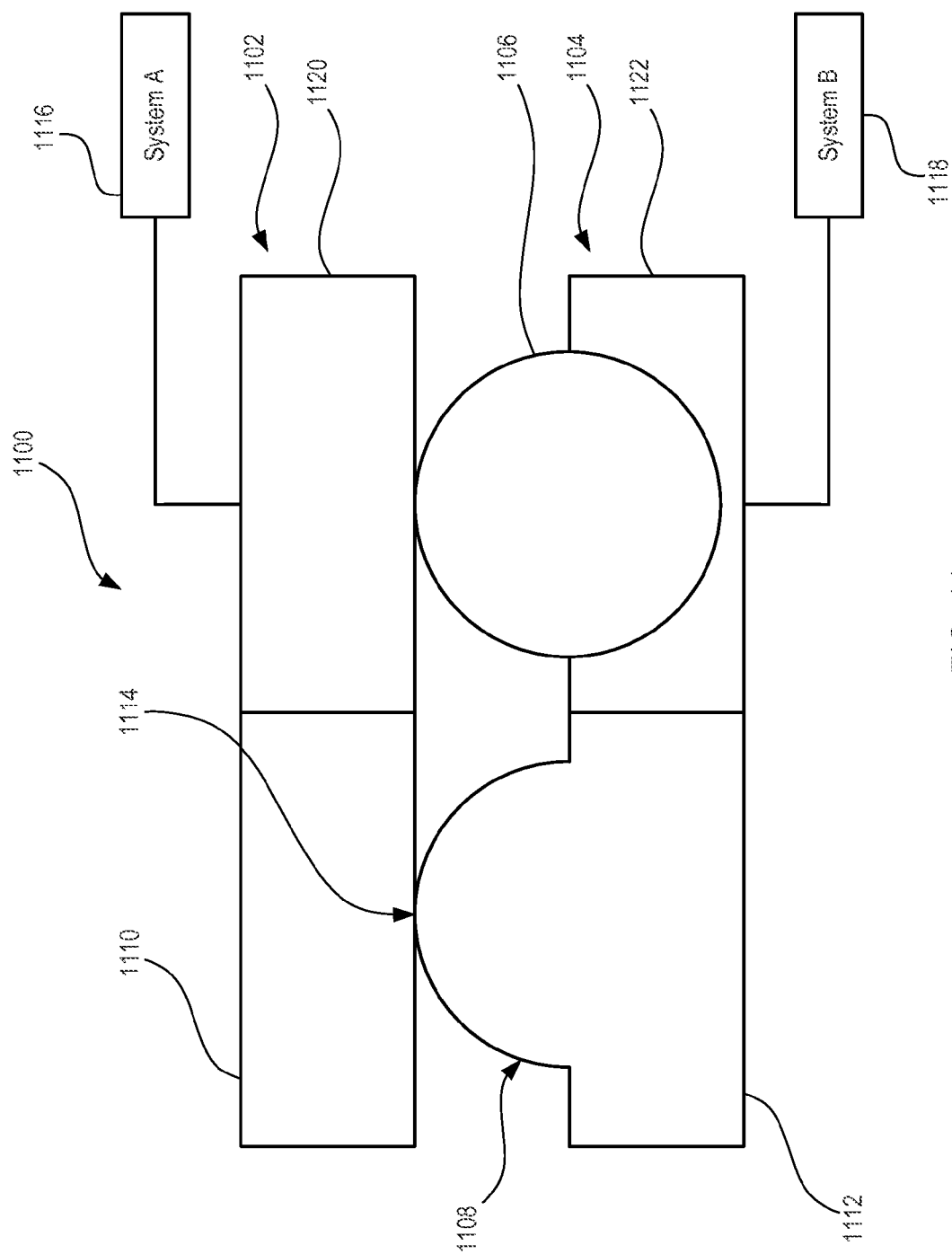
FIG. 11 is a cross-section view of a substrate with a distance-enforcing surface feature and a droplet contact area consistent with embodiments disclosed herein.
Figure 12:
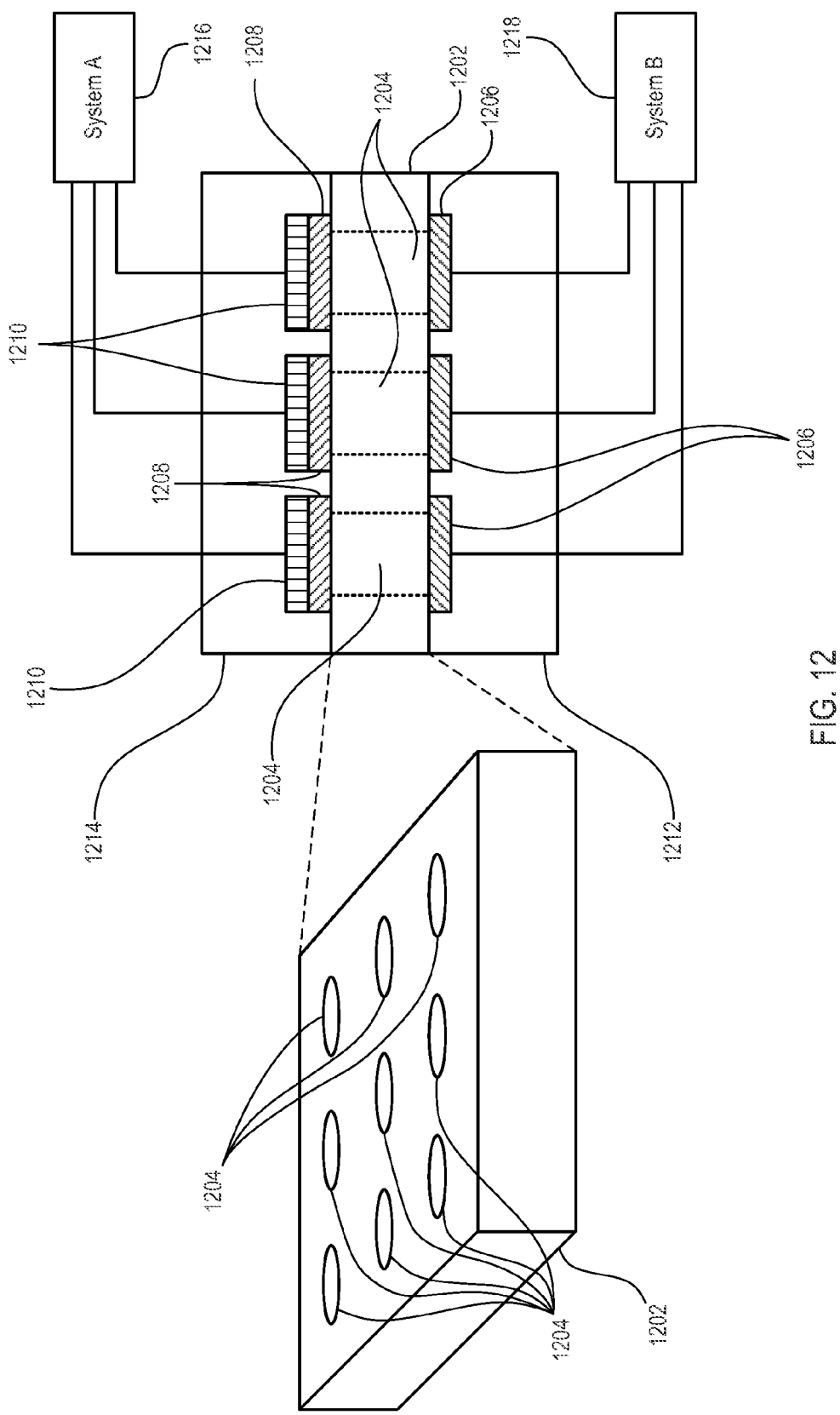
FIG. 12 is an exploded diagram illustrating an interlayer and a cross-section view of two substrates with the interlayer between them consistent with embodiments disclosed herein.

FIGS. 8 to 12 show cross-sectional views of a droplet and substrates with various surface geometries and configurations. For example, surface configurations can include surrounding the droplet as shown in FIG. 8, pressing on the droplet as shown in FIG. 9, and using geometry and layer configurations as shown in FIG. 10. Configurations for alignment of substrates can use a combination of surface geometry and droplets as shown in FIG. 11 or an interlayer as shown in FIG. 12. It should be recognized that a substrate can use a combination of layers (shown in FIGS. 3-5) and surface geometry (shown in FIGS. 8-12) to provide non-contact coupling between substrates. Although not shown in FIGS. 8-10 to simplify discussion of geometry, the droplet can act as a non-contact electric or plasmon coupling between substrates, including ways discussed above.

FIG. 8 is a cross-section view of two substrates with concave profiles. In the embodiment shown, first substrate 802 is lowered onto second substrate 804 with droplet 810 thereon. Both substrates 802 and 804 include concave profiles 806 and 808 (here, hemispherical cutouts) in which droplet 810 fits. In some embodiments, substrates 802 and 804 do not touch, but rest on droplet 810. Electric or plasmon coupling can then be accomplished between substrates 802 and 804 as described above.

For example, droplet 810 can be deposited in concave profile 808 of substrate 804. Placement of substrate 802 upon droplet 810 encourages substrate 802 to align droplet 810 with concave profile 806, due to surface tension of droplet 810. This placement can restrict movement of the substrates in translational directions. Additional droplets can be used to restrict movement of the substrates in rotational directions. In some embodiments, use of three droplets on substrates defines a fixed alignment of an interface between substrates. When placed on droplet 810, substrates 802 and 804 can exchange signals or AC power (depending on the configuration) using droplet 810 as described above.

FIG. 9 is a cross-section view of a first substrate with a concave profile and a second substrate with a convex profile. In the embodiment shown, first substrate 902 is lowered onto second substrate 908 with droplet 910 thereon. Substrate 908 includes concave profile 904 (here, a hemispherical cutout) in which droplet 910 fits. Substrate 902 includes a convex profile that, when lowered, encourages contact between droplet 910 and substrates 902 and 908. In some embodiments, substrates 902 and 908 do not touch, but rest on droplet 810. Electric or plasmon coupling can then be accomplished between substrates 902 and 908 as described above.

For example, droplet 910 can be deposited in concave profile 904 of substrate 908. Placement of substrate 902 upon droplet 910 encourages substrate 902 to align with concave profile 904. This placement can restrict movement of the substrates in translational directions. Additional profiles can be used to restrict movement of the substrates in rotational directions. In some embodiments, use of three droplets on substrates defines a fixed alignment of an interface between substrates. When placed on droplet 910, substrates 902 and 908 can communicate or provide AC power (depending on the configuration) using droplet 910 as described above.

In some embodiments, a first substrate can use surface geometry and a second substrate can use surface attraction. FIG. 10 is a cross-section view of first substrate 1004 with concave profile 1010 and second substrate 1002 with hydrophilic surface presented by hydrophilic layer 1008. Droplet 1006 can be placed on concave profile 1010 on substrate 1004. Due to surface tension of the liquid, the liquid can come to rest within concave profile 1010. Substrate 1002 can be placed upon droplet 1006. Due to an attraction between droplet 1006 and hydrophilic layer 1008, substrate 1002 can come to rest (or align) above concave profile 1010. When placed on droplet 1006, substrates 1002 and 1004 can communicate (via electric or plasmon modalities) or provide AC power (depending on the configuration) using droplet 910 as described above.

In some embodiments, surface features and droplets can be used together to define a distance between a first substrate and a second substrate. FIG. 11 is a cross-section view of a substrate with a distance-enforcing surface feature and a droplet contact area. Droplet 1106 can be placed on first substrate 1104 that includes convex profile 1108 (e.g., a hemispherical bump). Second substrate 1102 can be placed upon convex profile 1108 and droplet 106. Convex profile 1108 and droplet 106 define a distance between first substrate 1104 and second substrate 1102 in two dimensions. Another droplet or convex profile can be added to define a distance between first substrate 1104 and second substrate 1102 in three dimensions.

In some embodiments, substrates 1102 and 1104 can include inactive regions 1110 and 1112 and active regions 1120 and 1122. Inactive regions can be used for alignment, but lack capability of transmission of data or power (e.g., plasmon or electrical transmissions). Active regions 1120 and 1122 can be used for alignment and transmission. For example, active regions 1120 and 1122 with droplet 1106 can form a capacitor, as described above in FIG. 1. The capacitor can serve as a non-contact link between system A 1116 and system B 1118. System A 1116 can communicate with system B 1118 through the capacitor that includes droplet 1106.

Some embodiments can use an interlayer in between substrates. FIG. 12 is an exploded diagram illustrating interlayer 1202 and a cross-section view of two substrates 1214 and 1212 with an interlayer 1202 between them. Interlayer 1202 can include vias 1204 in which droplets can be located. Interlayer 1202 can then be placed between first substrate 1212 and second substrate 1214. Surface tension among the droplets in vias 1204 with hydrophilic pads 1206 and 1208 can cause interlayer 1202 to be pulled into alignment between substrates 1212 and 1214.

In the view shown in FIG. 12, interlayer 1202 can form non-contact connections between system A 1216 and system B 1218. Droplets can be formed from a conductive liquid and placed in vias 1204. Pads 1206 and layers 1210 can be conductive. Pads 1208 can be formed from dielectric material. The droplets in conjunction with pads 1208 and layers 1210 form individual capacitors. These capacitors can allow electric transmissions between system A 1216 and system B 1218 to pass through droplets in vias 1204.

In one example, interlayer 1202 can be immersed in liquid. Due to immersion and/or physical movement, liquid can enter vias 1204 (vias 1204 can also be coated with a hydrophilic coating). Interlayer 1202 can be placed upon a surface of hydrophilic pads 1206. Due to surface tension of the droplets attracting to hydrophilic pads 1206, interlayer 1202 aligns with substrate 1212 such that vias 1204 align with hydrophilic pads 1206. Substrate 1214 is placed on interlayer 1202. Due to surface tension of the droplets attracting to hydrophilic pads 1208, substrate 1214 aligns with interlayer 1202 such that vias 1204 align with hydrophilic pads 1208. While substrates 1212 and 1214 are approximately aligned with interlayer 1202, multiple simultaneous transmissions can be sent between system A 1216 and system B 1218 over droplets in vias 1204.

In other embodiments, interlayer 1202 itself can be used to align vias 1204 with pads 1206 and 1208 without relying on surface tension of the droplets. For example, interlayer 1202 can be mechanically aligned such that vias 1204 align with pads 1206 and 1208.

Interlayer 1202 can also receive droplets through methods other than immersion. Droplets can be formed onto interlayer 1202 (e.g., vapor deposition). Droplets can also be placed onto interlayer 1202 (e.g., through depositing, such as by an inkjet nozzle). Other placements of droplets are also possible (e.g., movement through a stream of liquid).

In some embodiments, droplets can be located in less than every droplet location. The droplets can be actively kept from a droplet location (e.g., via a barrier material, such as wax), or can be actively placed (e.g., an inkjet nozzle). See also FIGS. 28-31 for examples.

FIGS. 13 to 20 describe different types of surface geometries that can be used in conjunction with droplets that are used for coupling at least two substrates for transmissions. While these surface geometries are meant to serve as various examples, they are by no means exhaustive. In fact, it should be recognized that other geometries, including those disclosed above and below, can also be used. In addition, it should be recognized that various geometries can be combined (e.g., a hemispherical-topped cube).

Figure 13:
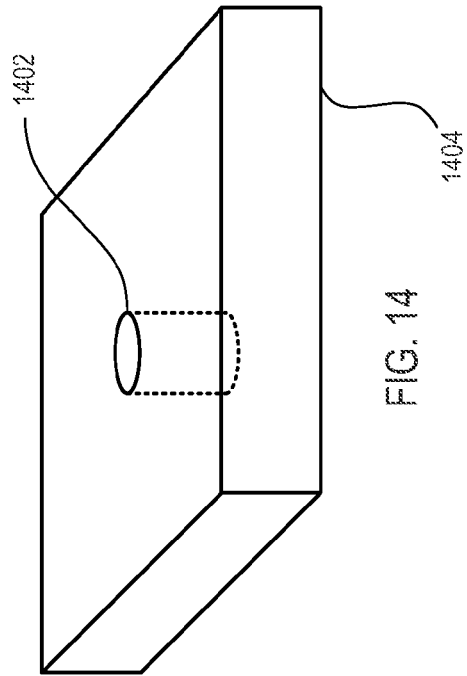
FIG. 13 is a perspective view of a concave pyramidal substrate feature consistent with embodiments disclosed herein.
Figure 14:
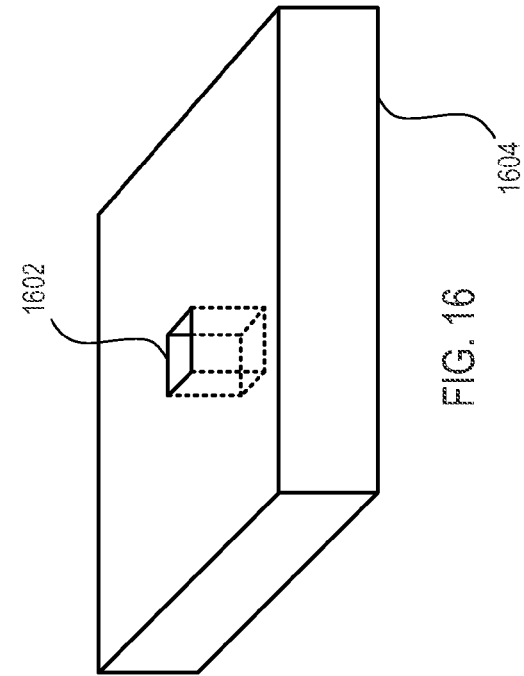
FIG. 14 is a perspective view of a concave cylindrical substrate feature consistent with embodiments disclosed herein.
Figure 15:
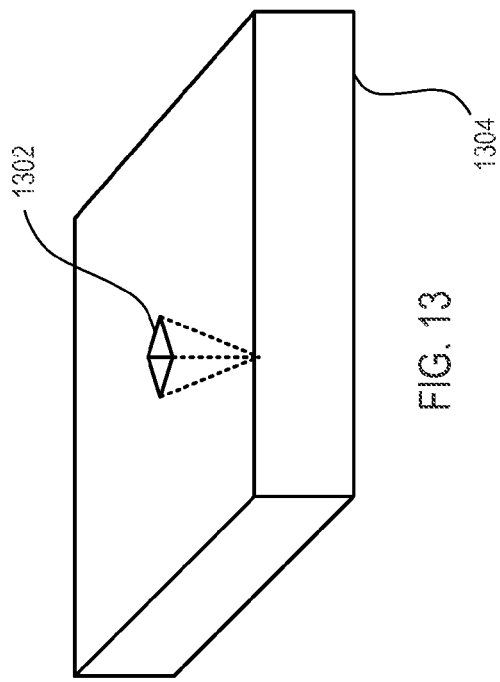
FIG. 15 is a perspective view of a concave spherical substrate feature consistent with embodiments disclosed herein.
Figure 16:
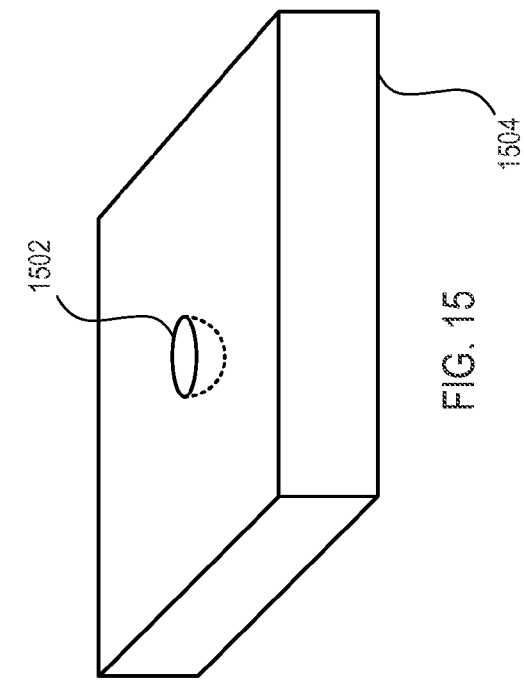
FIG. 16 is a perspective view of a concave box-shaped substrate feature consistent with embodiments disclosed herein.

Surface geometries can include concave structures with round, point, edge, and/or corner elements. FIG. 13 is a perspective view of a concave pyramidal substrate feature that includes sharp edge and point elements. FIG. 14 is a perspective view of a concave cylindrical substrate feature that includes rounded elements. FIG. 15 is a perspective view of a concave spherical substrate feature. FIG. 16 is a perspective view of a concave box-shaped substrate feature with corner elements.

Surface geometries can include convex structures with round, edge, and/or corner elements. FIG. 17 is a perspective view of a convex conical substrate feature with round and point elements. FIG. 18 is a perspective view of a convex spherical substrate feature with rounded elements. FIG. 19 is a perspective view of a convex box-shaped substrate feature with corner and edge elements.

Figure 20:
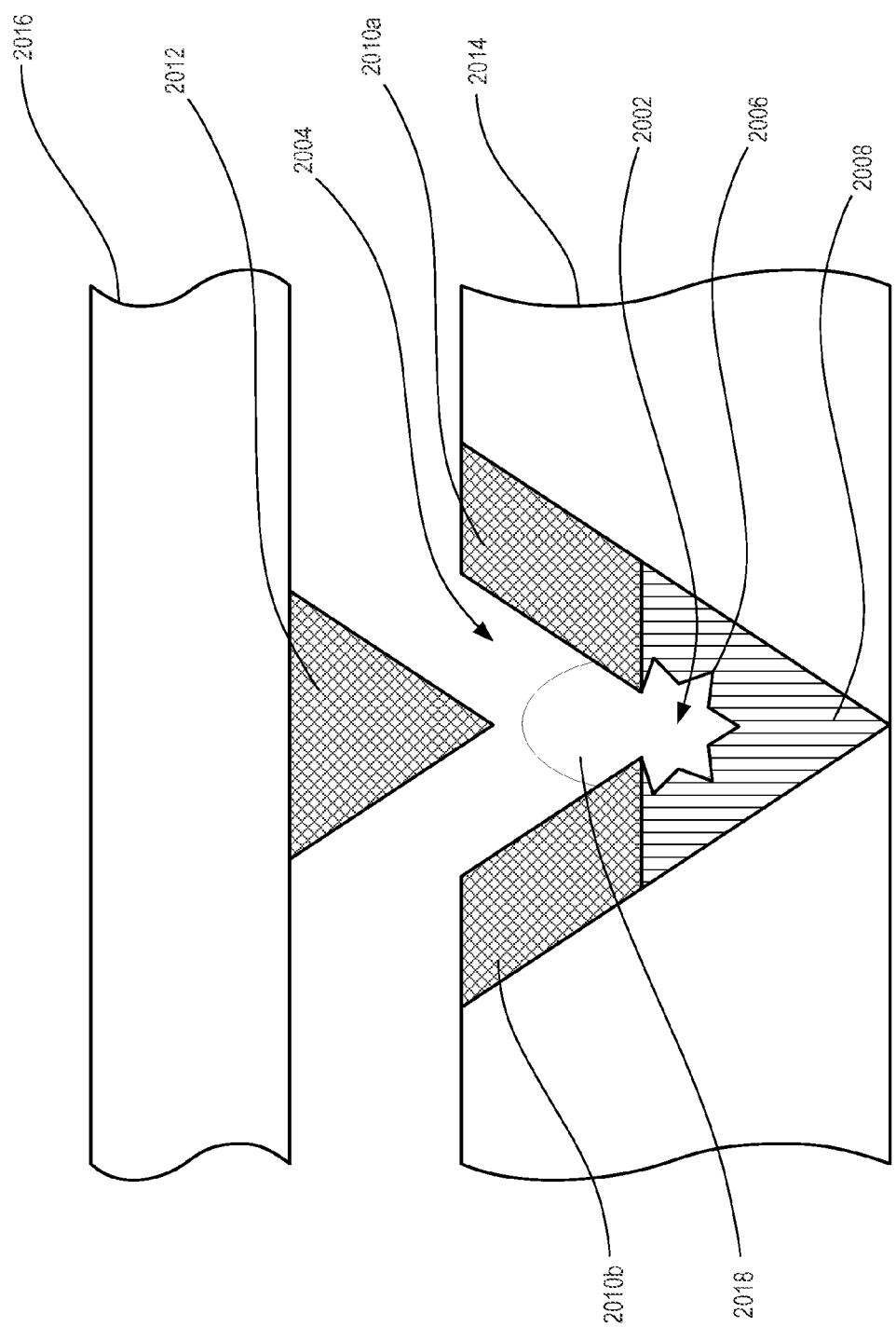
FIG. 20 is a cut-away view of substrates with a low wetting angle surface and a high wetting angle surface consistent with embodiments disclosed herein.

Surface geometries of substrates can include complementary features. FIG. 20 is a cut-away view of substrates 2014 and 2016 that can have a low wetting angle surface 2008 (hydrophilic) and a high wetting angle surfaces presented by elements 2010a, 2010b, and 2012 (hydrophobic). A high wetting angle can be equal to or greater than 90 degrees. A low wetting angle can be equal to or less than 90 degrees. These complimentary features can be used to aid in placement, contact with, and retention of droplet 2018.

In the embodiment shown in FIG. 20, droplet 2018 is placed in concave profile 2004 of substrate 2014. Substrate 2014 includes hydrophilic layer 2008 that includes geometric surfaces 2006 (e.g., edges) that increases contact with droplet 2018. Substrate 2014 also includes hydrophobic layers 2010a and 2010b that cause droplet 2018 to move away from hydrophobic layers 2010a and 2010b and center in concave profile 2004.

Substrate 2016 can be placed upon droplet 2018 and over substrate 2014. Convex profile 2012 (here, in the shape of a pyramid) can fit within concave profile 2004 and contact droplet 2018. Substrates 2014 and 2016 can form a capacitor with droplet 2018 (or gapped plasmon waveguide) as described above. In some embodiments, the surface tension and volume of droplet 2018 in contact with hydrophobic elements 2010a, 2010b, and 2012 can define a distance between substrates 2014 and 2016.

Surface geometries of substrates 2014 and 2016 and layer compositions of substrates 2014 and 2016 can be used to define droplet 2018 retention to substrates 2014 and 2016. In the embodiment shown, an attraction of droplet 2018 to droplet location 2002 aids droplet 2018 to remain in droplet location 2002. Hydrophobic convex profile 2012 can also repel droplet 2018, which causes droplet 2018 to remain in droplet location 2002.

Figure 21:
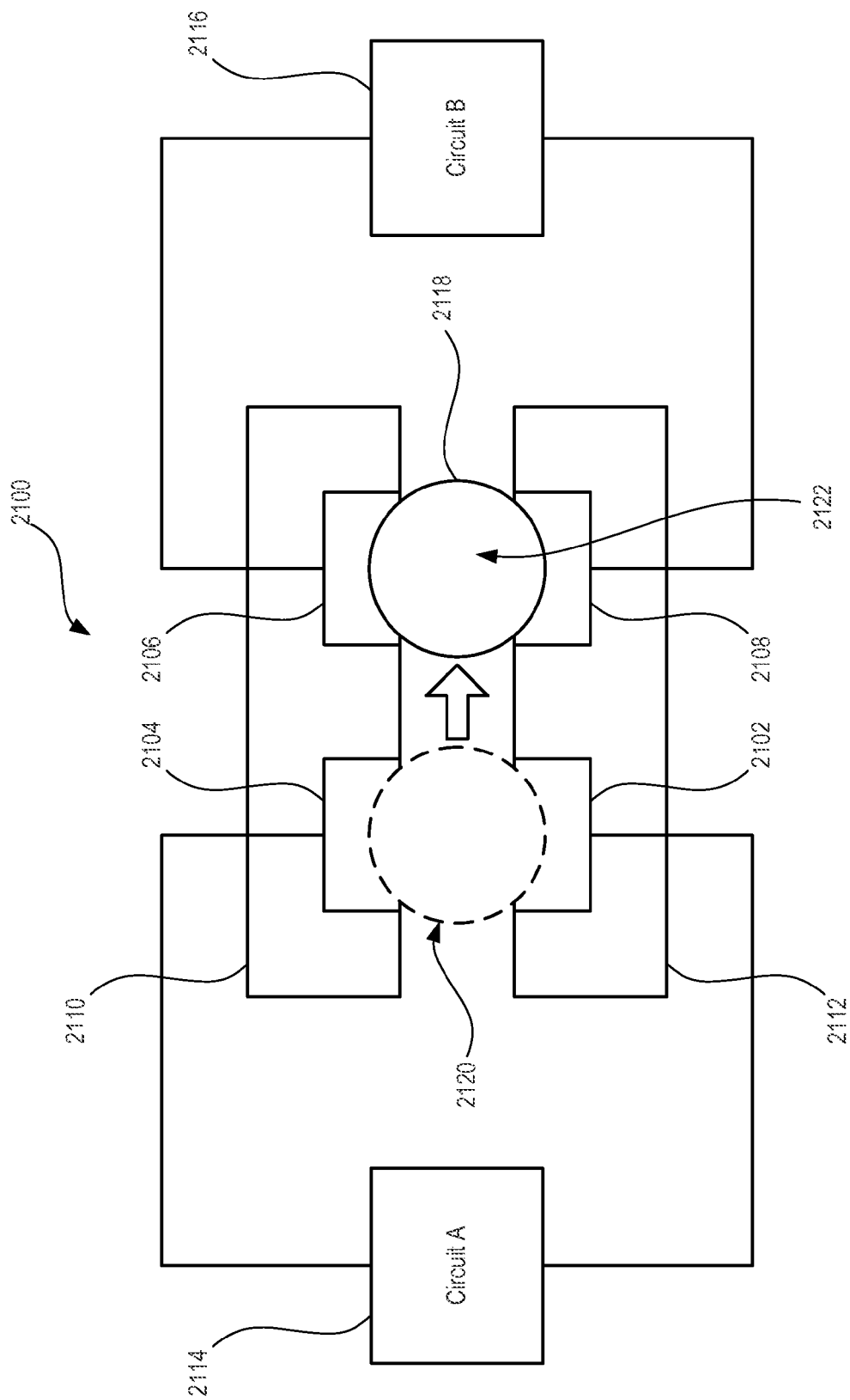
FIG. 21 is a cut-away view of substrates with a switchable circuit consistent with embodiments disclosed herein.
Figure 22:
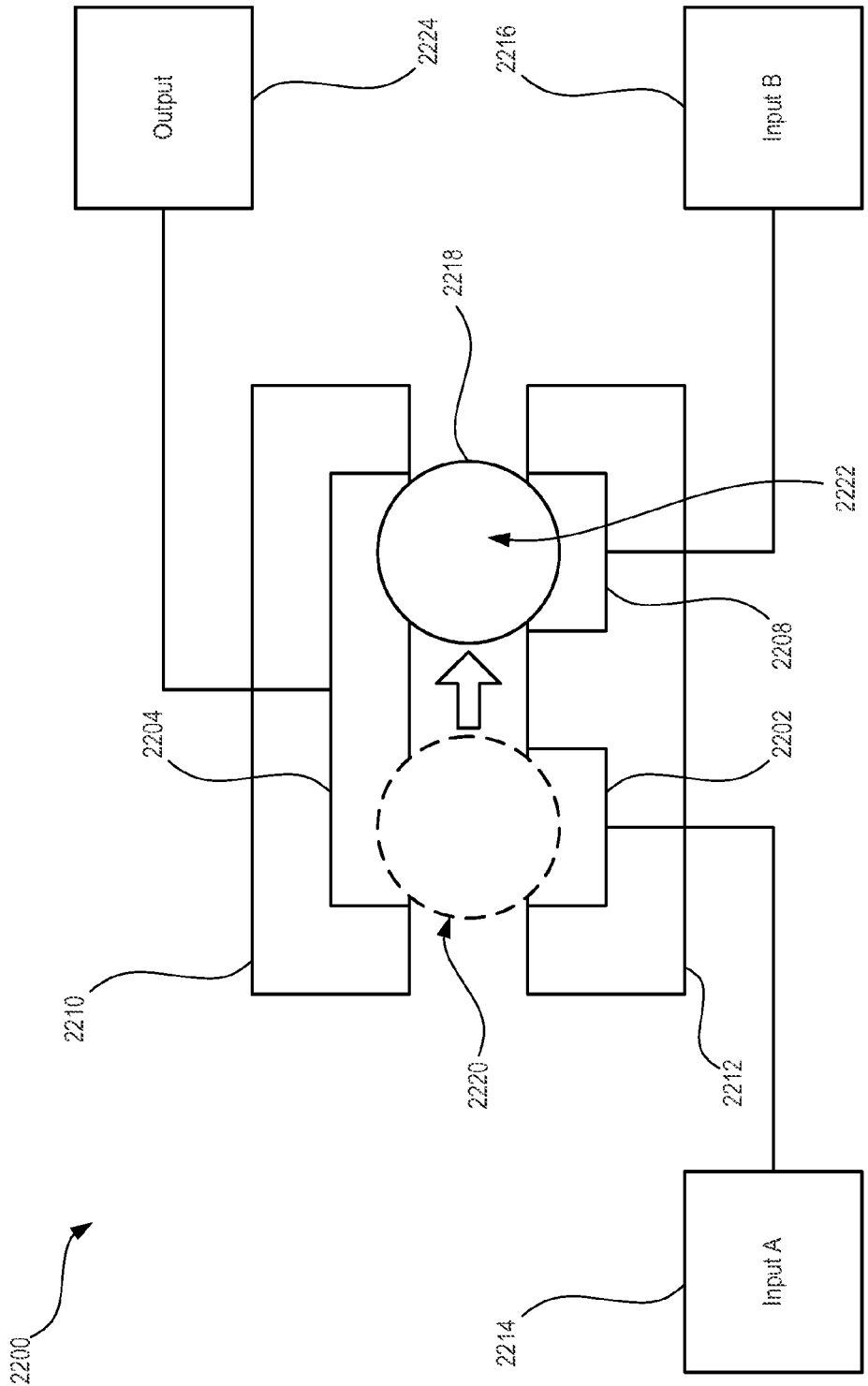
FIG. 22 is a cut-away view of substrates with a switchable input consistent with embodiments disclosed herein.
Figure 23:
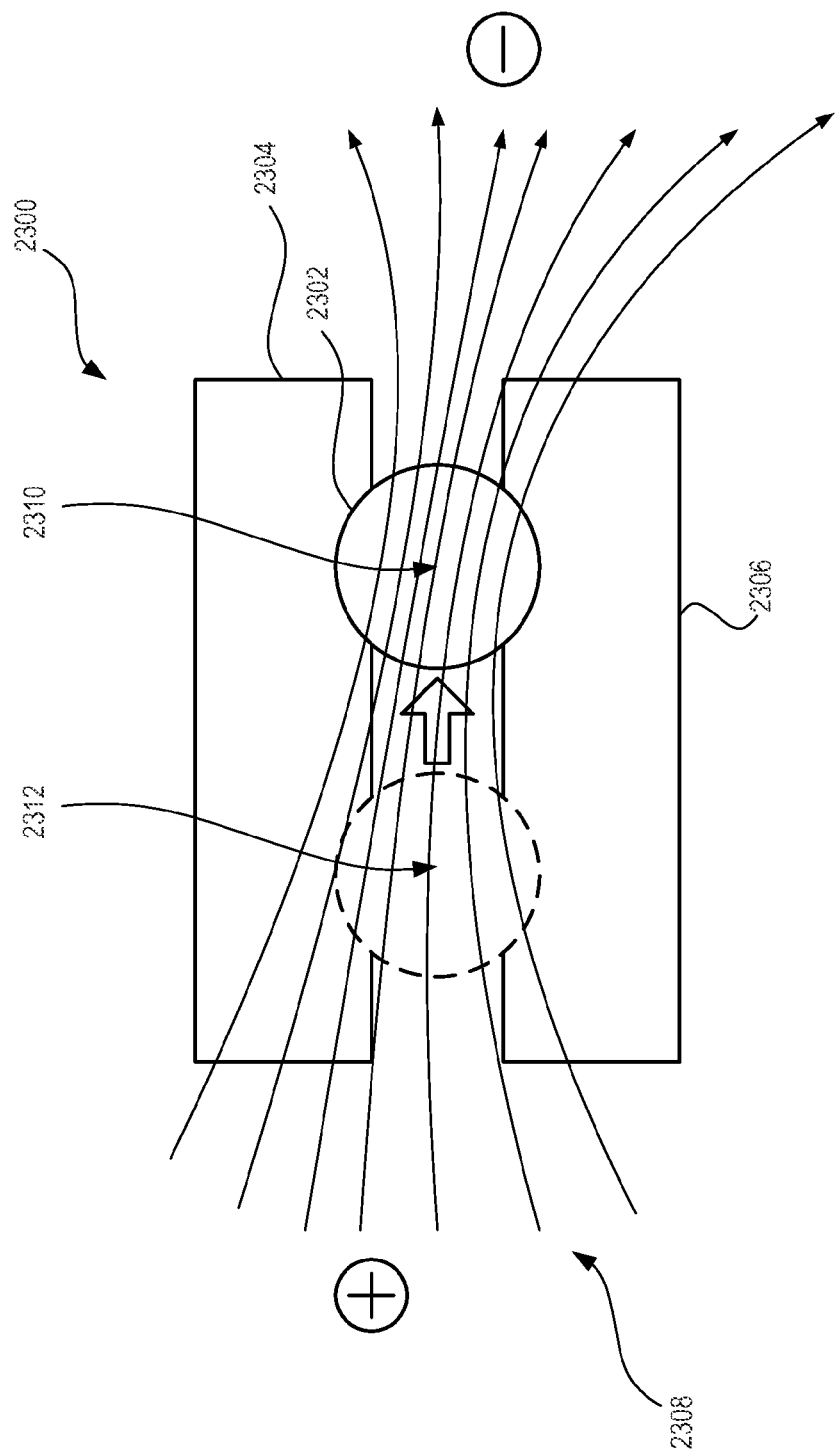
FIG. 23 is a cut-away view of substrates with an electrically switchable input consistent with embodiments disclosed herein.
Figure 24:
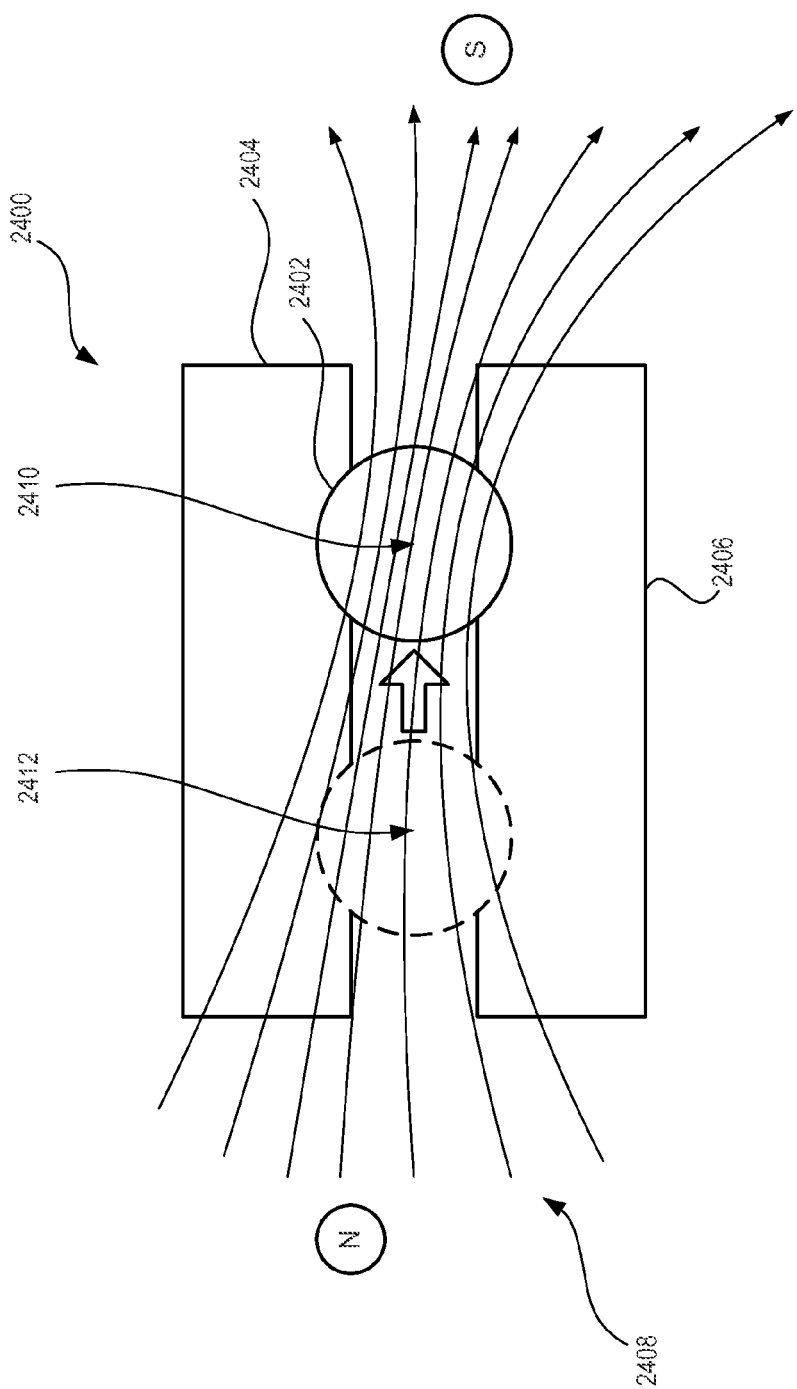
FIG. 24 is a cut-away view of substrates with a magnetically switchable input consistent with embodiments disclosed herein.
Figure 25:
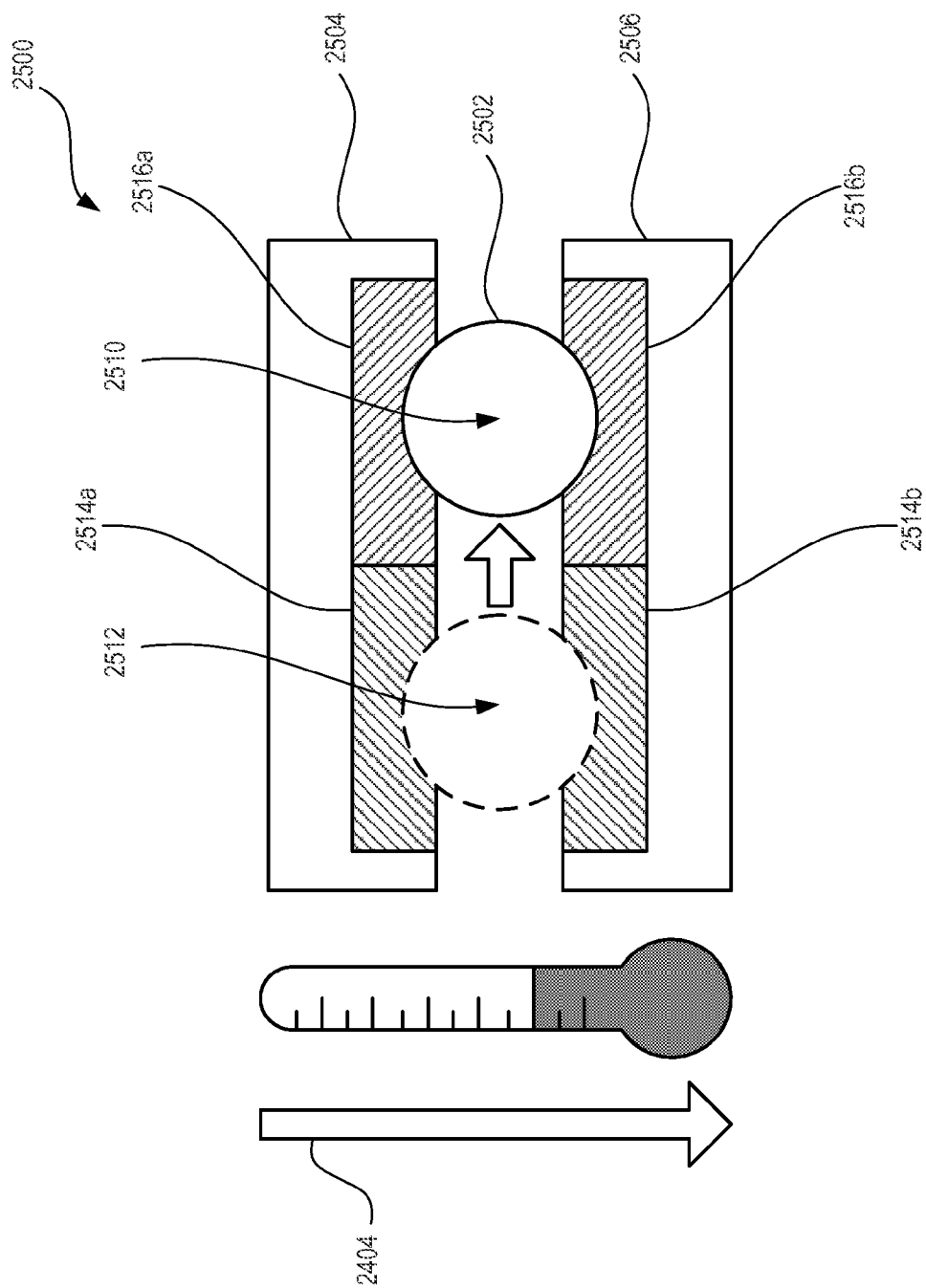
FIG. 25 is a cut-away view of substrates with a thermally switchable input consistent with embodiments disclosed herein.
Figure 26:
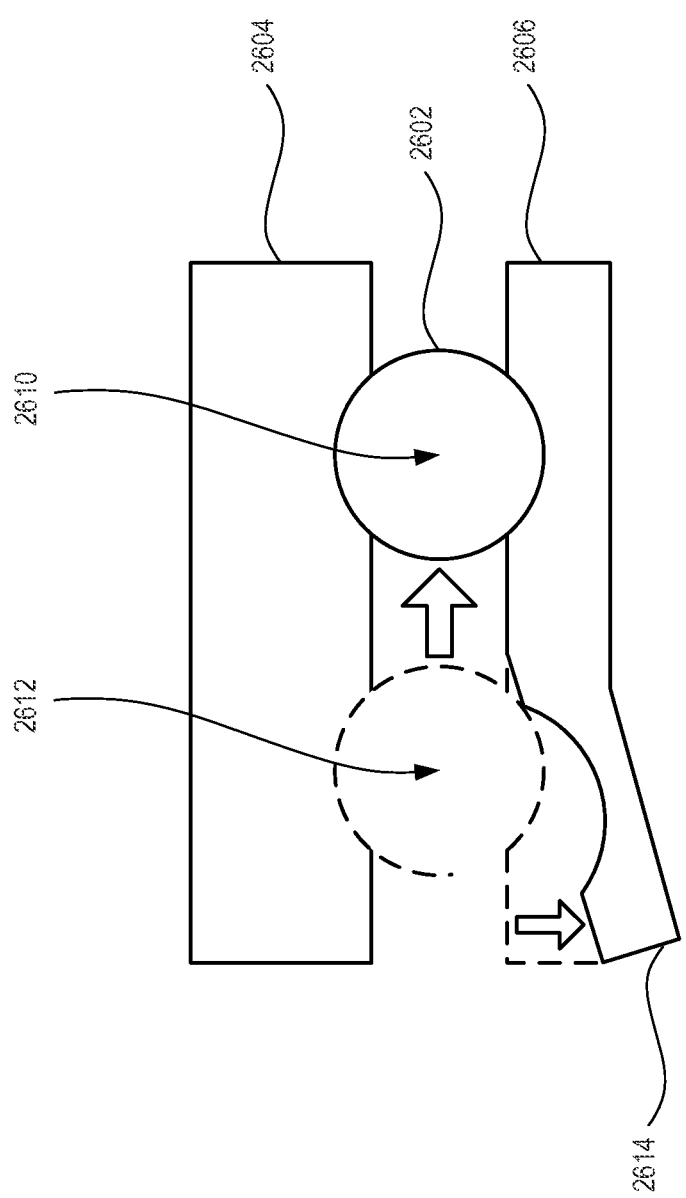
FIG. 26 is a cut-away view of substrates with a mechanically switchable input consistent with embodiments disclosed herein.

FIGS. 21 to 26 describe movement of droplets while in between substrates. This movement of droplets can allow switching of circuits, disabling of circuits, enabling of circuits, digital rights management (e.g., dynamically enabling or disabling features), switching of inputs, switching of outputs, and other connectivity changes. The movement of droplets can be accomplished by applied forces including electric field gradients, magnetic field gradients, mechanical forces, temperature changes causing a change in surface characteristics, temperature changes causing a change in droplet characteristics, etc. or even combinations thereof. FIG. 21 describes a switching of circuits. FIG. 22 describes a switching of inputs. FIG. 23 describes causing droplet movement through use of an electric field gradient. FIG. 24 describes causing droplet movement through use of a magnetic field gradient. FIG. 25 describes causing droplet movement through use of temperature. FIG. 26 describes causing droplet movement through use of mechanical means (e.g., microelectromechanical systems (MEMS)).

FIG. 21 is a cut-away view of substrates with switchable circuits. By moving droplet 2118 from location 2120 to location 2122, circuit A 2114 is disabled and circuit B 2116 is enabled. In some embodiments, the movement of droplet 2118 removes a critical component of a capacitor formed from droplet 2118, pad 2104, and pad 2102. Without droplet 2118, pads 2104 and 2102 can no longer pass electrical signals or power. In other embodiments, the movement of droplet 2118 removes a critical component of a plasmon interconnection (e.g., parallel plates or gapped waveguide). Without droplet 2118, pads 2104 and 2102 can no longer pass plasmon signals.

In the embodiment shown, the system 2100 includes two substrates 2110 and 2112 and two circuits 2114 and 2116. Substrates 2110 and 2112 include two droplet positions 2120 and 2122. Substrate 2110 includes pad 2104 associated with position 2120 and pad 2106 associated with position 2122. Substrate 2112 includes pad 2102 associated with position 2120 and pad 2108 associated with position 2122. A first capacitor associated with circuit A 2114 forms when droplet 2118 is between pads 2104 and 2102. A second capacitor associated with circuit B 2116 forms when droplet 2118 is between pads 2106 and 2108. Circuit A 2114 is activated when droplet 2118 is at location 2120 between pads 2102 and 2104 forming the first capacitor. Circuit B 2116 is activated when droplet 2118 is at location 2122 between pads 2106 and 2108 forming the second capacitor.

Movement of droplet 2118 can physically enable or disable circuits. This control over circuits can be used in several applications including power saving circuits, digital rights management, feature control, etc. For example, a system can have a low-power state and an active state. A low-power circuit can be enabled until droplet 2118 is moved from position 2120 to position 2122, which enables a full-power state. In another example, circuit B 2116 can contain keys for accessing protected information. When system 2100 determines that permission has been given to access protected information, droplet 2118 can be moved to position 2122, allowing access to keys within circuit B 2116. In one example, circuit A 2114 enables a 2 GHz clock rate and circuit B 2116 enables a 3 GHz clock rate. Upon determining that system 2100 is compatible with a 3 GHz clock rate, system 2100 can cause droplet 2118 to move from location 2120 to location 2122. The 2 GHz clock rate is disabled and the 3 GHz clock rate is enabled.

In some embodiments, circuit A 2114 may not exist and location 2120 can be used for an inactive state. When droplet 2118 moves to location 2122, circuit B 2116 can be enabled. This allows selective activation or deactivation of features.

Depending on the embodiment, droplet movement can be reversible, irreversible, or semi-reversible. In some embodiments, the movement can be reversible from position 2120 to position 2122 and back again. In other embodiments, the movement is irreversible (e.g., the droplet bonds with pads in the second position, the droplet surface tension makes it practically difficult to reverse, etc.). In one embodiment, the movement is one way, but can be reset by removing the droplet and replacing the droplet in the first position 2120 (i.e., semi-reversible).

In other embodiments, movement of a droplet can switch inputs or outputs to a common output or input. For example, FIG. 22 is a cut-away view of substrates with a switchable input. When droplet 2218 is at location 2220, output 2224 is connected to input A 2214. When droplet 2218 is at location 2222, output 2224 is connected to input B 2216. By switching droplet locations 2220 and 2222, system 2200 can reuse a single output for multiple inputs.

In the embodiment shown, system 2200 includes two substrates 2210 and 2212, one output 2224, and two inputs 2214 and 2216. Substrates 2210 and 2212 include two droplet positions 2220 and 2222. Substrate 2210 includes pad 2204 associated with both positions 2220 and 2222. Substrate 2212 includes pad 2202 associated with position 2220 and pad 2208 associated with position 2222. A first capacitor associated with input A 2214 forms when droplet 2218 is between pads 2204 and 2202. A second capacitor associated with input B 2216 forms when droplet 2218 is between pads 2204 and 2208. Input A 2214 is activated when droplet 2218 is at location 2220 between pads 2202 and 2204 forming the first capacitor. Input B 2216 is activated when droplet 2218 is at location 2222 between pads 2204 and 2108 forming the second capacitor.

For example, output provides 6 volts RMS at 1 microampere through substrate 2210. Substrate 2212 has two different systems that can receive power. A first system connected to input A 2214 is a diagnostic system that verifies that substrate 2212 and connected systems are operating correctly. A second system connected to input B 2216 is a medical lab on a chip system that operates after the diagnostic system verifies correct operation. While droplet 2218 is at position 2220, input A 2214 receives power for the diagnostic system. After the diagnostic system completes the verification, droplet 2218 can be moved to position 2222, which powers the medical lab on a chip. The diagnostic system is no longer operational, as the power now flows from pad 2204 to pad 2208 through droplet 2218. Droplet 2218 can be moved by means such as those discussed in FIGS. 23 to 26 or other means.

In other embodiments, a single input can be shared by multiple outputs. For example, a single input can share pad 2204. Output A can be connected to pad 2202 and output B can be connected to pad 2208. Movement of droplet 2218 between positions 2220 and 2222 can select which output is connected to the input.

In one embodiment, bi-directional communications lines can be selected. For example, a single bi-directional transceiver can share pad 2204. I/O transceiver A can be connected to pad 2202 and I/O transceiver B can be connected to pad 2208. Movement of droplet 2218 between positions 2220 and 2222 can select which I/O transceiver is connected to the input.

Droplets can be moved between locations using various environmental conditions, stimulus on the droplet, etc. FIG. 23 is a cut-away view of substrates 2304 and 2306 with an electrically switchable input. Droplet 2302 can be switched from position 2312 to position 2310 through use of electric field gradient 2308. Droplet 2302 can be electrically sensitive (e.g., conductive, charged, polar, etc.). For example, when placed within electric field gradient 2308, conductive droplet 2302 can overcome surface tension in position 2312 and move to position 2310. When in position 2310, electric field gradient 2308 can be disabled. Depending on the embodiment, the process can be reversible, irreversible, or semi-reversible. For example, in a reversible embodiment, electric field gradient 2308 can be reversed and droplet 2302 can overcome surface tension in position 2310 and move to position 2312.

FIG. 24 is a cut-away view of substrates 2404 and 2406 with a magnetically switchable input. Droplet 2402 can be switched from position 2412 to position 2410 through use of magnetic field gradient 2408. For example, droplet 2402 can be magnetically sensitive (e.g., ferromagnetic, contain suspended magnetically sensitive nanoparticles, etc.). When placed within magnetic field gradient 2408, droplet 2402 can overcome surface tension in position 2412 and move to position 2410. When in position 2410, magnetic field gradient 2408 can be disabled. Depending on the embodiment, the process can be reversible, irreversible, or semi-reversible. For example, in a reversible embodiment, magnetic field gradient 2408 can be reversed and droplet 2402 can overcome surface tension in position 2410 and move to position 2412.

FIG. 25 is a cut-away view of substrates 2504 and 2506 with a thermally switchable input. Droplet 2502 can be switched from position 2512 to position 2510 through use of a change in temperature 2404. At a first temperature droplet 2502 can be located at position 2512 (such as through a deposit). At this temperature, droplet 2502 has a low-energy state between pads 2514a and 2514b. When the temperature changes to a second temperature, droplet 2502 can be encouraged to move to position 2510, as a low-energy state is now found between pads 2516a and 2516b. Depending on the embodiment, the process can be reversible, irreversible, or semi-reversible.

For example, at a first temperature pads 2514a and 2514b have hydrophilic properties that decrease as the temperature approaches a second temperature. Pads 2516a and 2516b can have hydrophilic properties that increase as the temperature approaches the second temperature. As the temperature changes from the first temperature to the second temperature, droplet 2502 can be attracted to and move to a location between pads 2516a and 2516b. In some embodiments, pads 2514a and 2514b have hydrophobic properties that increase as the temperature approaches a second temperature, repelling droplet 2502.

In some embodiments, a temperature gradient (e.g., differences in temperature) can be used. For example, pads 2514a and 2514b can be at a first temperature and pads 2516a and 2516b can be at a second temperature. At a first temperature, pads 2514a, 2514b, 2516a, and 2516b can attract droplet 2502. At a second temperature, pads 2514a, 2514b, 2516a and 2516b can repel droplet 2502. By creating a temperature differential, droplet 2502 can be moved from position 2512 to position 2510. Depending on the embodiment, the process can be reversible, irreversible, or semi-reversible.

It should be recognized that a charged droplet and/or magnetic droplet can operate similarly to the above droplets in field gradients. For example, an electrically charged droplet can be induced to switch positions when an electric field is applied.

FIG. 26 is a cut-away view of substrates 2604 and 2606 with a mechanically switchable input. In some embodiments, droplet 2602 can be mechanically moved between positions 2612 and 2610. In the embodiment shown, MEMS lever 2614 is used to stretch droplet 2602 when in position 2612, causing it to move to position 2610 due to surface tension. MEMS lever 2614 can be electromechanically activated (or mechanically, thermally, chemically, etc.). Other MEMS or mechanical means are also possible.

It should be recognized that any of the embodiments described in FIGS. 23 to 26 can also be configured as non-contact electrical or plasmon transmission mediums, as described in FIGS. 21 to 22 (or elsewhere).

Figure 27:
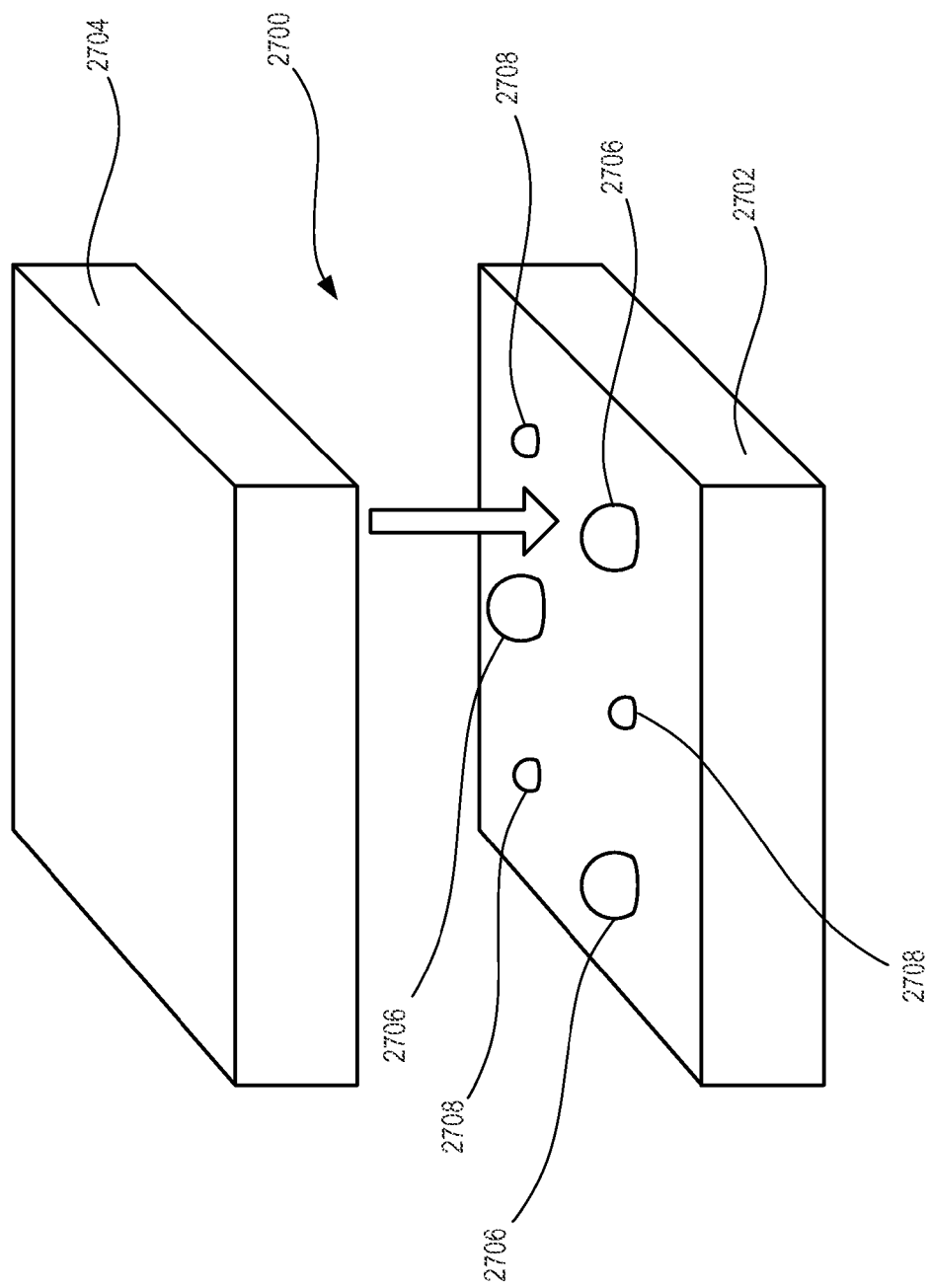
FIG. 27 is a perspective view of substrates with coarse adjustment droplets and fine adjustment droplets consistent with embodiments disclosed herein.

FIG. 27 is a perspective view of substrates with coarse adjustment droplets and fine adjustment droplets. In addition to providing transmission mediums between substrates 2702 and 2704, droplets 2706 and 2708 can be used for coarse and fine alignment of substrates 2702 and 2704. For example, substrate 2702 can have larger and smaller droplets placed on its surface. Substrate 2704 can be lowered upon substrate 2702. Larger droplets 2706 can be used for coarse adjustment of substrates 2702 and 2704, as the corresponding substrate features (geometrical, layers, hydrophilic nature, hydrophobic nature, etc.) are larger and more easily matched. As larger droplets 2706 align and substrate 2704 grows closer to substrate 2702, smaller droplets 2708 on substrate 2702 can engage with features on substrate 2704. Smaller droplets 2708 provide fine adjustment of the alignment between substrates 2702 and 2704, engaging after the larger droplets 2706. However, in some embodiments, larger droplets 2706 and smaller droplets 2708 can be configured to engage at the same time or approximately the same time.

Figure 28:
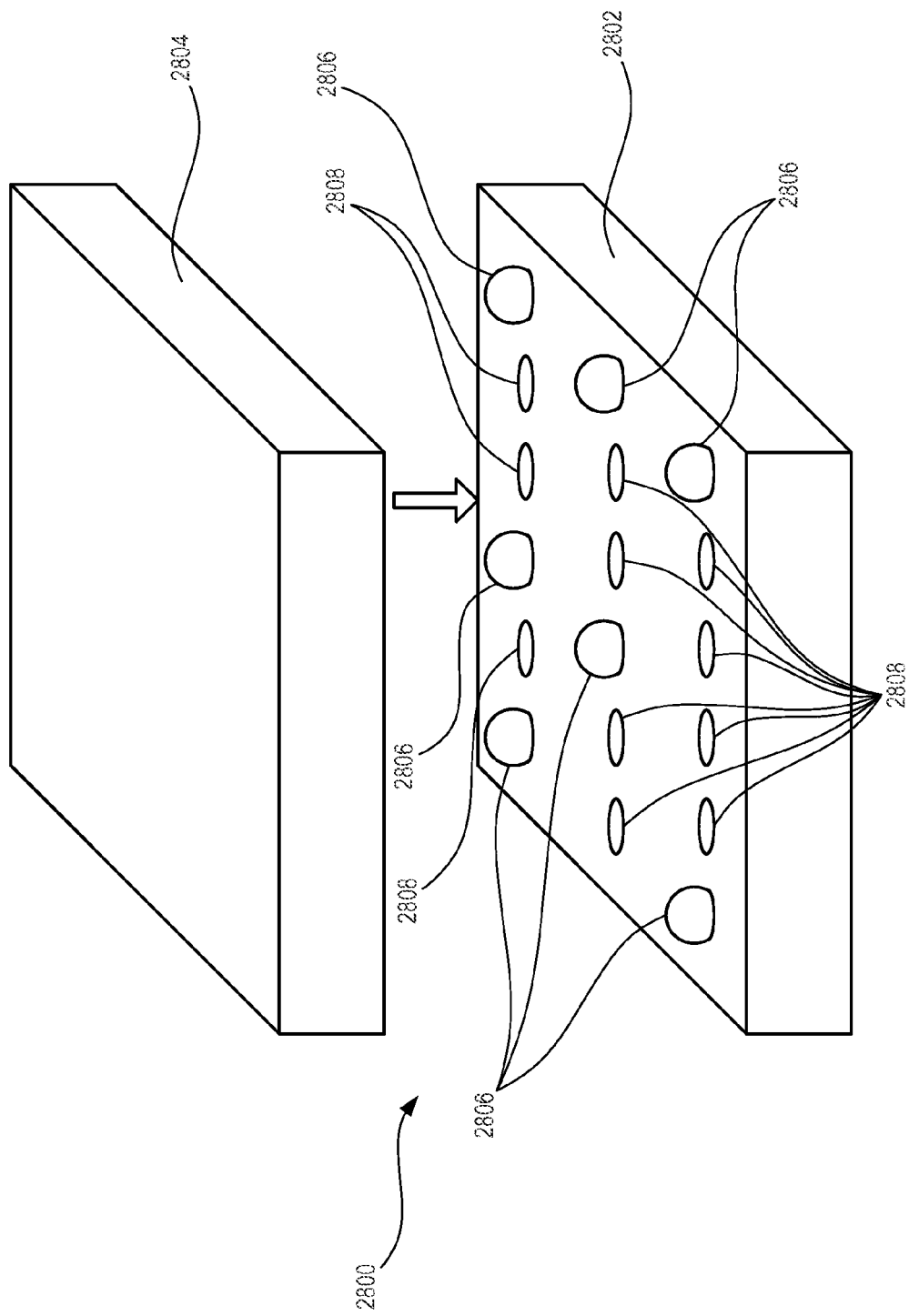
FIG. 28 is a perspective view of substrates with droplets forming a configuration consistent with embodiments disclosed herein.
Figure 29:
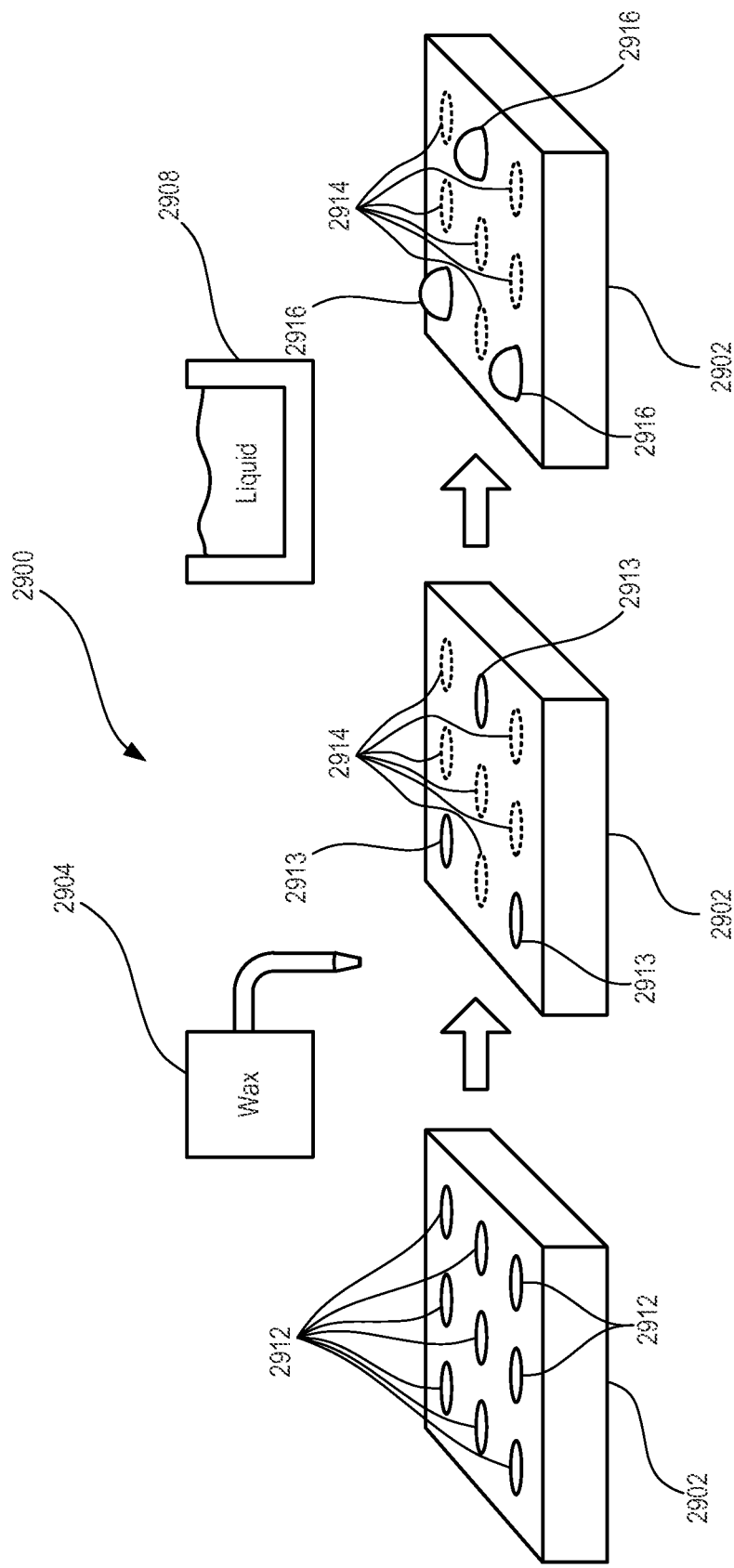
FIG. 29 is a diagram of a droplet formation on a substrate using liquid immersion consistent with embodiments disclosed herein.
Figure 30:
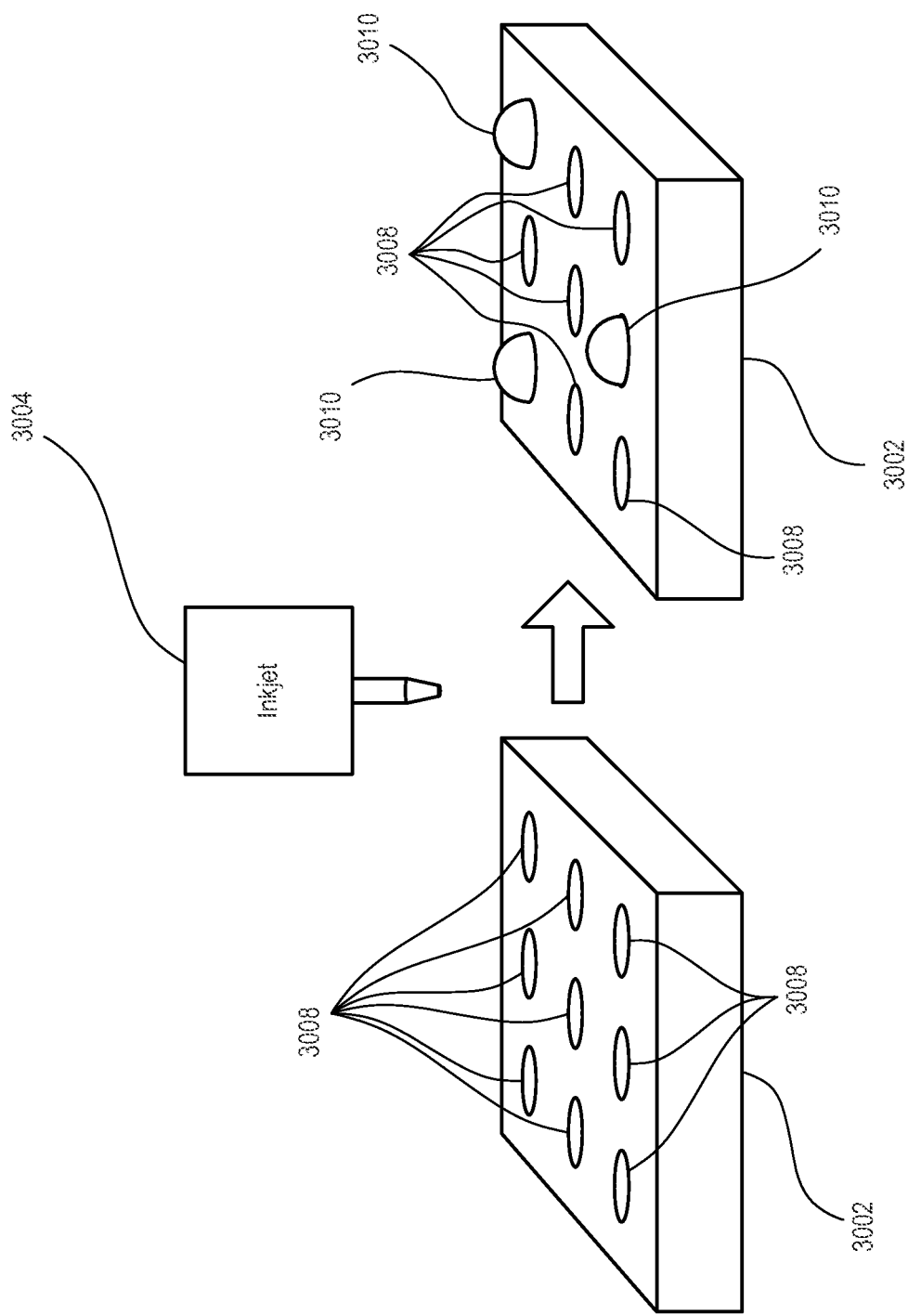
FIG. 30 is a diagram of a droplet formation on a substrate using inkjet deposit consistent with embodiments disclosed herein.
Figure 31:
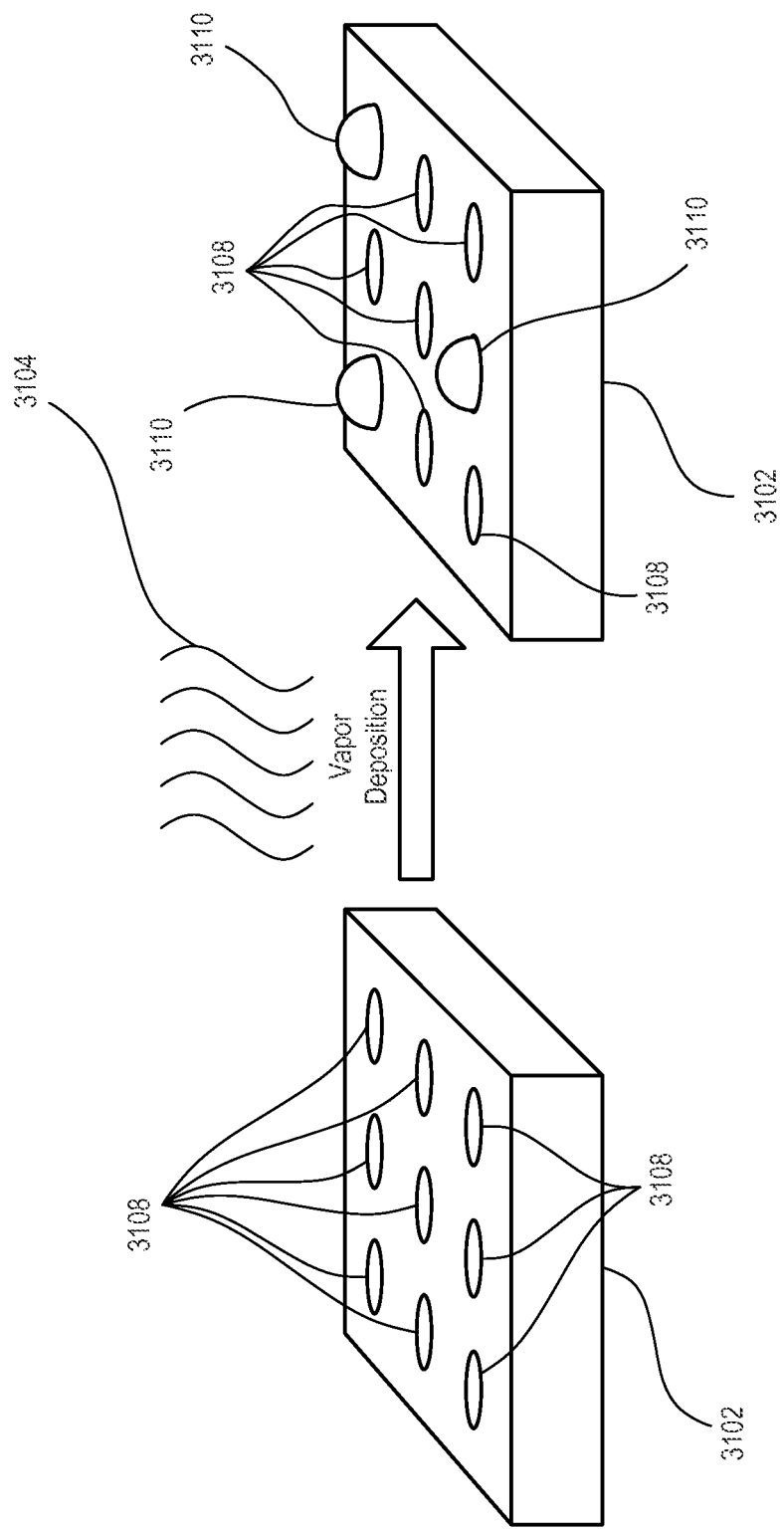
FIG. 31 is a diagram of a droplet formation on a substrate using vapor deposition consistent with embodiments disclosed herein.

FIGS. 28 to 31 describe configuring systems through depositing droplets at selected locations between substrates. In some embodiments, droplets can be placed at selected locations on a first substrate. When a second substrate is placed on the first substrate, non-contact connections are formed. Which of the non-contact connections are formed (and sometimes those that are not formed) can indicate a desired configuration between the two substrates. FIG. 28 shows an example configuration using droplets. FIG. 29 shows an example of creating a configuration using liquid immersion. FIG. 30 shows an example of creating a configuration using inkjet deposition. FIG. 31 shows an example of creating a configuration using vapor deposition.

FIG. 28 is a perspective view of substrates with droplets forming a configuration. A configuration can be determined by which locations 2808 contain droplets 2806. When droplets 2806 are present, an electrical or plasmon connection is enabled between substrates 2802 and 2804. Computing resources (e.g., circuits, processors, sensors, etc.) can detect electrical or plasmon connectivity at locations 2808 that include droplets 2806. Using this information, a computing resource can enable functions, disable functions, configure resources, etc. as a result of determining the droplet configuration. In some embodiments, locations 2808 without droplets 2806 are sensed and used as a configuration. In other embodiments, both locations 2808 with droplets 2806 and locations 2808 without droplets 2806 are used to determine a configuration.

For example, a grid of droplet locations 2808 can be formed on first substrate 2802 that forms part of a SRAM controller. Droplets 2806 can be disposed on selected locations 2808 on first substrate 2802. Substrate 2804 that forms a SRAM chip can be placed upon substrate 2802. Substrates 2802 and 2804 can test which locations 2808 pass electric or plasmon signals (as described above, including FIG. 1). Based on these signals, processors connected to substrates 2802 and 2804 can determine SRAM features (e.g., clock speed, latency, manufacturer, and size).

Forming droplets to make a configuration can occur in multiple ways. In one embodiment, a substrate can prevent droplets from forming at specific locations. FIG. 29 shows a diagram of a system 2900 for droplet formation on a substrate using liquid immersion. Substrate 2902 with a set of locations 2912 can be formed. After a configuration is selected, a droplet-repelling substance (shown here as wax, but photoresists and other technologies can be used) can be disposed on substrate 2902, such as through dispenser 2904. The droplet-repelling substance can form blocked locations 2914 that no longer accept droplets 2916. Substrate 2902 can then be immersed in liquid 2908, allowing droplets 2916 to form in remaining locations 2913.

In another embodiment, droplets 3010 can be directly disposed on substrate 3002 to form a configuration. For example, FIG. 30 shows a diagram of a droplet formation on substrate 3002 using inkjet nozzle 3004. After a configuration is determined, a subset of locations 3008 can receive droplets 3010 by direct placement by inkjet nozzle 3004. Inkjet nozzle 3004 can allow for precise volumes and locations of droplets 3010.

In another embodiment, droplets 3110 can be attracted to a subset of locations 3108 on substrate 3102 to form a configuration. For example, FIG. 31 is a diagram of a droplet formation on substrate 3102 using vapor deposition. Selected locations from locations 3108 can include a substance that attracts liquid vapor deposition products. When used with vapor deposition, the selected locations can build up a volume of droplets 3110 at the selected locations. In other embodiments, locations can be blocked (such as described above) and only unblocked locations receive the vapor deposition.

In one embodiment, droplets can be placed at all locations and selected droplets can be removed. For example, selected droplets can be removed by suction. In another example, droplets can be removed by evaporation or ablation (e.g., exposure to high temperatures or laser light). In another example, droplets can be removed by mechanical means such as a wicking action provided by woven threads applied to the droplets.

Figure 32:
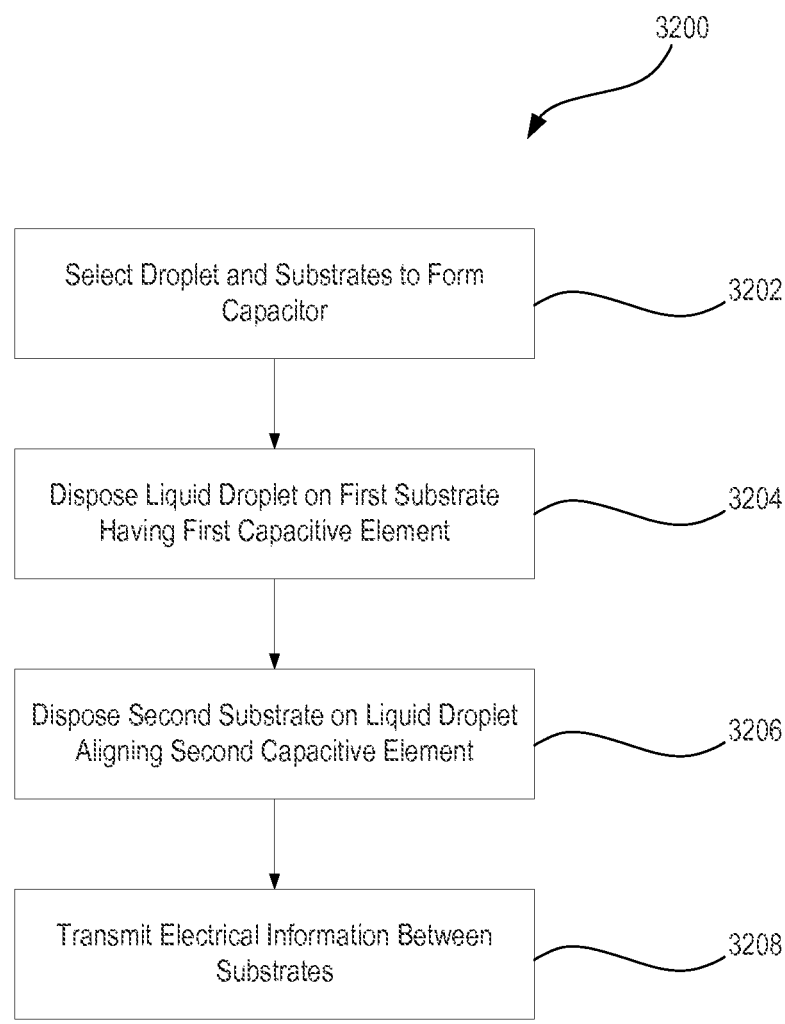
FIG. 32 is a flowchart illustrating a method for non-contact signaling between substrates consistent with embodiments disclosed herein.

FIG. 32 is a flowchart illustrating a method 3200 for non-contact signaling between substrates. The method can be accomplished by system 100 as shown in FIG. 1, including substrates 102 and 104, droplet 106, and coupling elements 108 and 110. In box 3202, droplets and substrates are selected to form a capacitor. In box 3204, liquid droplets are disposed on a first substrate that has capacitive elements. In box 3206, a second substrate is disposed on the liquid droplet aligning a second capacitive element of the second substrate. The first capacitive element of the first substrate and the second capacitive element of the second capacitive substrate form a capacitor. In box 3208, electrical information is transmitted between substrates through the capacitor.

It should be recognized that the method 3200 can be altered for plasmon modalities. For example, instead of a capacitor, a gapped plasmon waveguide can be formed from the substrates and droplet.

Figure 33:
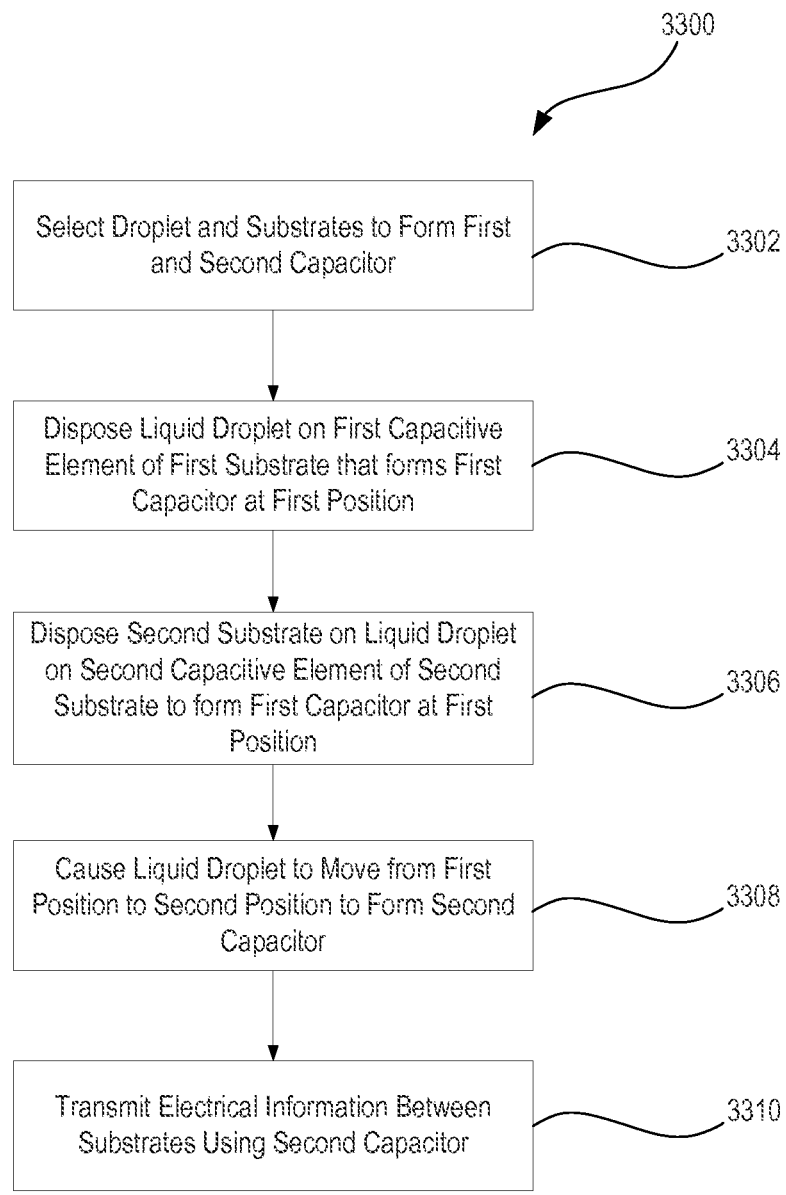
FIG. 33 is a flowchart illustrating a method for switchable non-contact coupling between substrates consistent with embodiments disclosed herein.

FIG. 33 is a flowchart illustrating a method 3300 for switching non-contact coupling between substrates. The method can be accomplished by system 2100 as shown in FIG. 21, including substrates 2110 and 2112, droplet 2118, and pads 2102, 2104, 2106, and 2108.

It should be recognized that the method 3300 can be altered for plasmon modalities. For example, instead of a capacitor, a gapped plasmon waveguide can be formed from the substrates and droplet. In box 3302, a droplet and substrates are selected to form a first capacitor and a second capacitor. In box 3304, a liquid droplet is disposed on a first capacitive element of a first substrate that is used to form a first capacitor at a first position. In box 3306, a second substrate is disposed on a liquid droplet using a second capacitive element of the second substrate to form the first capacitor at the first position of the droplet. In box 3308, the droplet is moved from a first position (forming the first capacitor) to a second position to form a second capacitor between the first substrate and the second substrate. By moving the droplet, the first capacitor is disabled. In box 3310, electrical information is transmitted between substrates using the second capacitor. In some embodiments, signals can be transmitted between substrates through the first capacitor while the droplet is at the first position.

Figure 34:
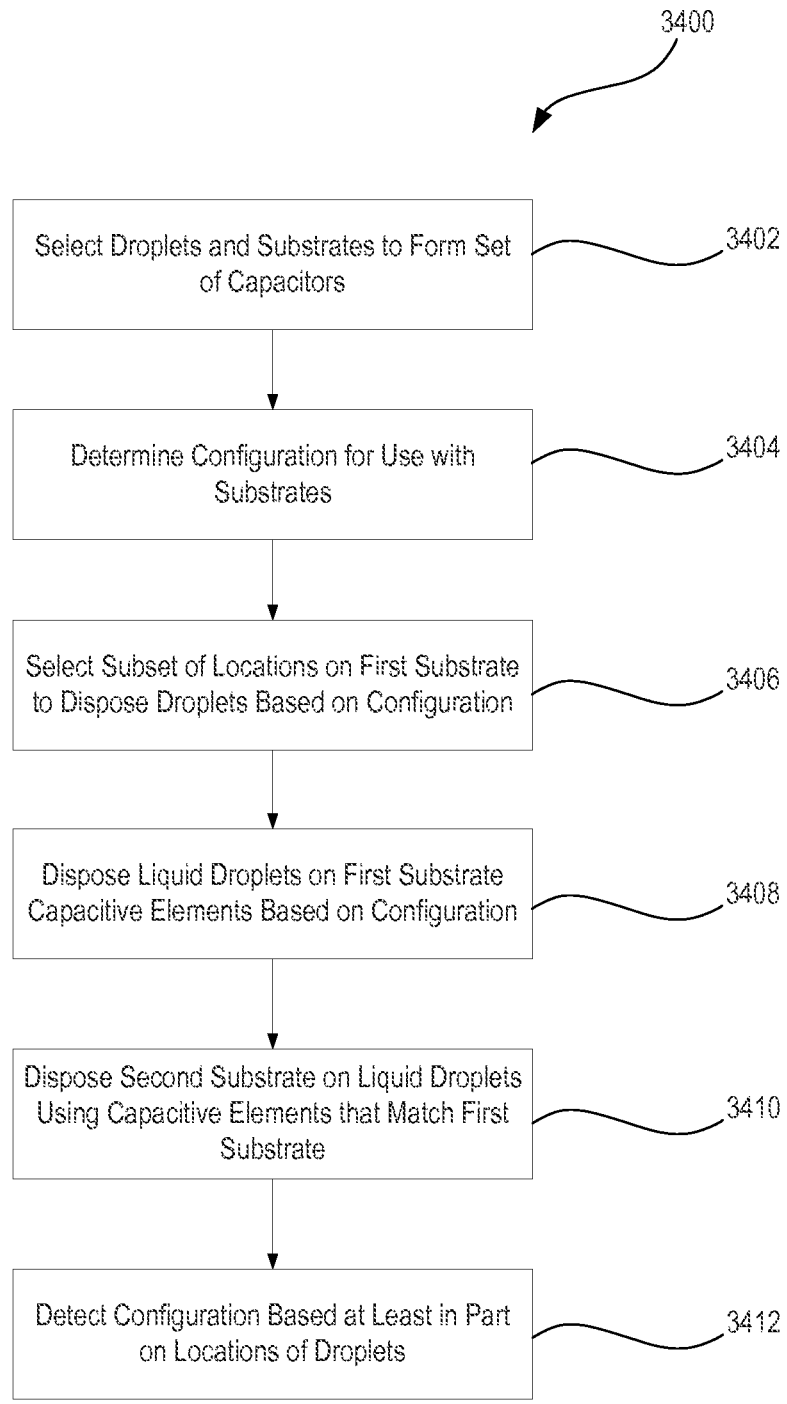
FIG. 34 is a flowchart illustrating a method for configuring inter-substrate coupling consistent with embodiments disclosed herein.

FIG. 34 is a flowchart illustrating a method 3400 for configuring inter-substrate coupling. The method can be accomplished by system 2800 as shown in FIG. 28, including substrates 2802 and 2804, droplets 2806, and locations 2808. In box 3402, droplets and substrates are selected to form a set of capacitors at locations where a droplet sits between substrates. In box 3404, a configuration is selected that determines which locations will receive droplets. In box 3406, a subset of locations on a first substrate is selected to receive droplets based at least in part on the configuration. In box 3408, liquid droplets are disposed on capacitive elements of the first substrate based on the configuration. In box 3410, the second substrate is disposed on the liquid droplets, matching capacitive elements between the substrates. In box 3412, a configuration is detected based at least in part on locations of droplets between the substrates. This detection can be based on success or failure of transmission of electrical energy between the substrates.

It should be recognized that the method 3400 can be altered for plasmon modalities. For example, instead of a capacitor, a gapped plasmon waveguide can be formed from the substrates and droplets.

FIG. 35 is a diagram of a liquid well on a substrate using temperature to activate a coupling of substrate pads. In the example shown substrate 3516 can be placed on substrate 3518. Substrate 3518 contains well 3502 filled with liquid 3504. As temperature 3514 increases, liquid 3504 expands to fill area 3508. As liquid 3504 fills area 3508, liquid 3504 contacts pads 3506a and 3506b. With liquid 3504 between pads 3506a and 3506b, electrical signals and/or power can connected between substrate 3516 and substrate 3518. Hydrophobic areas 3512 can be placed near the pads to help ensure the liquid remains in area 3508 and between pads 3506a and 3506b.

FIG. 36 is a diagram of liquid well 3602 on substrate 3606 using increasing temperature 3608 to activate a coupling using expansion well 3604. Liquid in well 3602 is at a level lower than expansion well 3604. As temperature increases, liquid in well 3602 expands and overflows into expansion well 3604. As expansion well 3604 is much smaller than well 3604, liquid from well 3604 can fill all or part of expansion well 3604. Liquid can be encouraged to remain within wells, as substrate outside of wells 3602 and 3604 can be made hydrophobic. When expansion well 3604 is filled with liquid, electrical signals and/or power can be connected between substrate 3606 and other substrates. In some embodiments a first pad is located within the expansion well 3604, and a second pad is located on a substrate placed over expansion well 3604.

It should be recognized that the methods described above can also include both plasmon and electric modalities. In some embodiments, substrate-coupling elements with droplets can pass both electric and plasmon signals simultaneously. In other embodiments, substrate-coupling elements with droplets can switch between electric and plasmon signals.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, off-the-shelf semiconductors such as logic chips, transistors, or other discrete components. A component may also be implemented in programmable hardware devices such as field programmable gate arrays, programmable array logic, programmable logic devices, or the like.

Reference throughout this specification to "an example" means that a particular feature, structure, or characteristic described in connection with the example is included in at least one embodiment of the present invention. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described in detail to avoid obscuring aspects of the invention.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

Those having skill in the art will appreciate that many changes may be made to the details of the above-described embodiments without departing from the underlying principles of the invention. The scope of the present invention should, therefore, be determined only by the following claims.

What is claimed is:

1. A system comprising:
   a first chip including a first capacitive coupling element, the first capacitive coupling element having a surface geometry;
   a second chip including a second capacitive coupling element, wherein the first chip and the second chip have different functions; and
   a liquid droplet disposed between the first capacitive coupling element and the second capacitive coupling element to create a capacitor, wherein the liquid droplet acts as a spacer, provides alignment between the first chip and the second chip, and communicatively couples the first chip and the second chip when the liquid droplet is located between and in contact with the first chip and the second chip.

2. The system of claim 1, wherein the first chip comprises a first dielectric layer disposed between the first capacitive coupling element and the liquid droplet.

3. The system of claim 2, wherein the second chip comprises a second dielectric layer disposed between the second capacitive coupling element and the liquid droplet.

4. The system of claim 1, wherein the liquid droplet comprises a conductive liquid.

5. The system of claim 4, wherein the conductive liquid comprises a liquid metal.

6. The system of claim 5, wherein the liquid metal reacts with the first capacitive coupling element or the second capacitive coupling element.

7. The system of claim 4, wherein the conductive liquid comprises a nonmetallic liquid including conductive particles.

8. The system of claim 1, wherein the liquid droplet comprises a non-conductive liquid.

9. A system comprising:
   a first electronic circuit substrate including a first non-contact communication element and a plurality of first liquid droplet contact areas, wherein at least one of the plurality of first liquid contact areas includes a surface geometry;
   a second electronic circuit substrate including a second non-contact communication element and a plurality of second liquid droplet contact areas, wherein the first electronic circuit substrate and the second electronic circuit substrate have different functions; and
   a plurality of liquid droplets, each of the plurality of liquid droplets disposed between a corresponding pair of a first liquid droplet contact area and a second liquid droplet contact area including a first liquid droplet disposed between the first non-contact communication element and the second non-contact communication element,
   wherein the first liquid droplet acts as a spacer, provides alignment between the first electronic circuit substrate and the second electronic circuit substrate, and communicatively couples the first non-contact communication element and the second non-contact communication element when the first liquid droplet is located between the first electronic circuit substrate and the second electronic circuit substrate.

10. The system of claim 9, wherein the first non-contact communication element comprises a conducting pad.

11. The system of claim 10, wherein the conducting pad makes direct electrical contact with a liquid droplet from the plurality of liquid droplets.

12. The system of claim 10, wherein the conducting pad forms a half-capacitor.

13. The system of claim 10, wherein the conducting pad comprises half of a plasmonic waveguide.

14. The system of claim 9, wherein at least some of the first plurality of liquid droplet contact areas comprise a variation in a surface of the first electronic circuit substrate.

15. The system of claim 14, wherein the variation comprises a first material defining the at least some of the first plurality of liquid droplet contact areas surrounded by a second material.

16. The system of claim 15, wherein the first material is formed from a material configured to attract a droplet.

17. The system of claim 15, wherein the second material is formed from a material configured to repel a droplet.

18. The system of claim 15, wherein the first material comprises a material having a wetting angle less than 90 degrees.

19. A first electronic circuit substrate for use in a modular electronic system, the first electronic circuit substrate comprising:
   a first non-contact communication element; and
   a liquid droplet contact area that is in contact with a liquid droplet;
   wherein the liquid droplet acts as a spacer between the first electronic circuit substrate and a second electronic circuit substrate and aligns the first non-contact communication element with a second non-contact communication element of the second electronic circuit substrate, wherein the first electronic circuit substrate and the second electronic circuit substrate have different functions.

20. The first electronic circuit substrate of claim 19, further comprising one or more additional liquid droplet contact areas.

21. The first electronic circuit substrate of claim 20, wherein the liquid droplet contact area and at least one of the one or more additional liquid droplet contact areas vary in size to provide varying degrees of alignment.

22. The first electronic circuit substrate of claim 21, wherein the liquid droplet contact area or at least one of the one or more additional liquid droplet contact areas further comprise a first set of liquid droplet contact areas configured for coarse alignment of the first electronic circuit substrate to the second electronic circuit substrate.

23. The first electronic circuit substrate of claim 22, wherein the liquid droplet contact area or at least one of the one or more additional liquid droplet contact areas further comprise a second set of liquid droplet contact areas configured for fine alignment of the first electronic circuit substrate to the second electronic circuit substrate.

24. The first electronic circuit substrate of claim 23, wherein the coarse alignment of the first set of liquid droplet contact areas enables the second set of liquid droplet contact areas to perform the fine alignment.

25. The first electronic circuit substrate of claim 19, further comprising an interlayer disposed between the first electronic circuit substrate and the second electronic circuit substrate, the interlayer having a via configured to contain the liquid droplet.

26. The first electronic circuit substrate of claim 25, wherein the interlayer is removable from the first electronic circuit substrate and the second electronic circuit substrate.

27. The first electronic circuit substrate of claim 25, wherein the interlayer is affixed to the first electronic circuit substrate.

28. A method comprising:
disposing a liquid droplet between a first capacitive coupling element on a first electronic circuit substrate and a second capacitive coupling element on a second electronic circuit substrate to create a capacitor between the first electronic circuit substrate and the second electronic circuit substrate, wherein the liquid droplet acts as a spacer between the first electronic circuit substrate and the second electronic circuit substrate, provides alignment between the first electronic circuit substrate and the second electronic circuit substrate, and communicatively couples the first capacitive coupling element and the second capacitive coupling element when the liquid droplet is located between the first electronic circuit substrate and the second electronic circuit substrate, wherein the first electronic circuit substrate and the second electronic circuit substrate have different functions.

29. The method of claim 28, further comprising disposing the liquid droplet between a first contact area on the first electronic circuit substrate and a second contact area on the second electronic circuit substrate.

30. The method of claim 29, wherein the liquid droplet adheres more strongly to the first contact area than the second contact area such that upon separation of the first electronic circuit substrate and the second electronic circuit substrate the liquid droplet remains on the first electronic circuit substrate.

31. The method of claim 29, further comprising aligning the first electronic circuit substrate and the second electronic circuit substrate relative to each other using the liquid droplet in contact with the first contact area and the second contact area.

32. The method of claim 31, further comprising disposing one or more additional liquid droplets between corresponding contact areas on the first electronic circuit substrate and the second electronic circuit substrate, wherein the one or more additional liquid droplets are configured to align the first and second electronic circuit substrate relative to each other.

33. The method of claim 28, further comprising disposing an interlayer between the first electronic circuit substrate and the second electronic circuit substrate, wherein the interlayer is disposed between two liquid droplets and providing an insulating layer between the two liquid droplets, the two liquid droplets including the liquid droplet.

34. The method of claim 28, further comprising providing an electrical channel of communication between the first electronic circuit substrate and the second electronic circuit substrate using the liquid droplet.

35. The method of claim 28, further comprising disposing the first capacitive coupling element and the second capacitive coupling element to form parallel planes configured for plasmon interconnection.

36. The method of claim 28, further comprising coupling plasmons via the capacitor through the first capacitive coupling element to the second capacitive coupling element.

37. The system of claim 1, wherein the surface geometry comprises a concave structure.

38. The system of claim 1, wherein the surface geometry comprises a convex structure.

* * * * *